(12) United States Patent
Kim

(10) Patent No.: US 10,712,954 B2
(45) Date of Patent: Jul. 14, 2020

(54) NONVOLATILE MEMORY DEVICE, METHOD OF OPERATING NONVOLATILE MEMORY DEVICE AND STORAGE DEVICE INCLUDING THE SAME

(71) Applicant: Samsung Electronics Co., Ltd., Suwon-si, Gyeonggi-do (KR)

(72) Inventor: Seung-Bum Kim, Hwaseong-si (KR)

(73) Assignee: Samsung Electronics Co., Ltd. (KR)

( * ) Notice: Subject to any disclaimer, the term of this patent is extended or adjusted under 35 U.S.C. 154(b) by 63 days.

(21) Appl. No.: 16/111,813

(22) Filed: Aug. 24, 2018

(65) Prior Publication Data
US 2019/0196744 A1   Jun. 27, 2019

(30) Foreign Application Priority Data
Dec. 22, 2017   (KR) ........................ 10-2017-0177848

(51) Int. Cl.
*G06F 3/06* (2006.01)
*G11C 16/30* (2006.01)
(Continued)

(52) U.S. Cl.
CPC .......... *G06F 3/0619* (2013.01); *G06F 3/0604* (2013.01); *G06F 3/0659* (2013.01); *G06F 3/0679* (2013.01); *G06F 11/1068* (2013.01); *G11C 5/143* (2013.01); *G11C 11/5671* (2013.01); *G11C 16/0483* (2013.01); *G11C 16/08* (2013.01); *G11C 16/10* (2013.01); *G11C 16/14* (2013.01); *G11C 16/26* (2013.01); *G11C 16/30* (2013.01); *G11C 29/52* (2013.01); *H01L 27/1157* (2013.01); *H01L 27/11565* (2013.01); *G11C 2029/0409* (2013.01); *G11C 2029/1206* (2013.01); *H01L 27/11582* (2013.01)

(58) Field of Classification Search
CPC ...................................................... G06F 3/0619
See application file for complete search history.

(56) References Cited

U.S. PATENT DOCUMENTS 7,315,915 B2   1/2008   Fukuda et al.
8,537,615 B2   9/2013   Maeda
(Continued)

OTHER PUBLICATIONS

Search Report of the Intellectual Property Office of Singapore, SG Application No. 10201811112R, Jun. 28, 2019, 3 pp.

*Primary Examiner* — Steve N Nguyen
(74) *Attorney, Agent, or Firm* — Myers Bigel, P.A.

(57) ABSTRACT

Nonvolatile memory device includes a memory cell array and a control circuit. The memory cell array includes a plurality of memory blocks, the memory blocks including a plurality of memory cells coupled to word-lines respectively, the word-lines are stacked vertically on a substrate, and some memory cells of the plurality of memory cells are selected by sub-block unit smaller than one memory block. The control circuit divides sub-blocks of a first memory block into at least one bad sub-block and at least one normal sub-block based on error occurrence frequency of each of the sub-blocks, and applies different program/erase cycles to the at least one bad sub-block and the at least one normal sub-block based on a command and an address provided from external to the nonvolatile memory device. The at least one bad sub-block and the at least one normal sub-block are adjacent each other.

18 Claims, 27 Drawing Sheets

(51) Int. Cl.
*G11C 5/14* (2006.01)
*H01L 27/1157* (2017.01)
*H01L 27/11565* (2017.01)
*G06F 11/10* (2006.01)
*G11C 11/56* (2006.01)
*G11C 16/04* (2006.01)
*G11C 16/08* (2006.01)
*G11C 16/10* (2006.01)
*G11C 16/14* (2006.01)
*G11C 16/26* (2006.01)
*G11C 29/52* (2006.01)
*G11C 29/04* (2006.01)
*G11C 29/12* (2006.01)
*H01L 27/11582* (2017.01)

(56) References Cited

U.S. PATENT DOCUMENTS

| | | | |
|---|---|---|---|
| 8,769,374 B2 | 7/2014 | Franceschini et al. | |
| 8,787,088 B2 | 7/2014 | Dutta et al. | |
| 8,788,910 B1* | 7/2014 | Northcott | G06F 11/1012 714/763 |
| 8,837,228 B2 | 9/2014 | Nam et al. | |
| 8,909,493 B2 | 12/2014 | Avila et al. | |
| 9,015,561 B1* | 4/2015 | Hu | G11C 16/0483 714/773 |
| 9,299,439 B2 | 3/2016 | Ghodsi | |
| 9,355,724 B2 | 5/2016 | Oh et al. | |
| 9,362,003 B2* | 6/2016 | D'Abreu | G11C 29/04 |
| 9,530,517 B2 | 12/2016 | Lee et al. | |
| 9,564,233 B1* | 2/2017 | Cho | G11C 16/3459 |
| 2006/0002190 A1* | 1/2006 | Roohparvar | G11C 16/3418 365/185.17 |
| 2009/0193221 A1* | 7/2009 | Reid | G06F 12/0246 711/202 |
| 2011/0157981 A1* | 6/2011 | Sharon | G11C 11/5642 365/185.03 |
| 2012/0314499 A1* | 12/2012 | Yuan | G11C 16/26 365/185.11 |
| 2013/0028022 A1* | 1/2013 | Vali | G11C 16/10 365/185.18 |
| 2013/0205076 A1* | 8/2013 | Schuette | G06F 12/0246 711/103 |
| 2014/0063938 A1 | 3/2014 | Oh et al. | |
| 2014/0269090 A1* | 9/2014 | Flynn | G11C 16/14 365/185.19 |
| 2014/0372678 A1* | 12/2014 | Moon | G06F 12/0246 711/103 |
| 2015/0135025 A1* | 5/2015 | Kim | G06F 12/0246 714/704 |
| 2015/0186065 A1 | 7/2015 | Seo | |
| 2016/0162185 A1* | 6/2016 | D'Abreu | G06F 11/076 711/103 |
| 2016/0170682 A1* | 6/2016 | Bakshi | G06F 3/0649 711/103 |
| 2017/0132125 A1* | 5/2017 | Cai | G06F 11/1072 |

\* cited by examiner

Vwe1 < Vwe2 < VERS

Vwe1 < VERS

Vwe1 < VERS1 < VERS2

VRPASS12 < VRPASS11

VRPASS22 < VRPASS21

NONVOLATILE MEMORY DEVICE, METHOD OF OPERATING NONVOLATILE MEMORY DEVICE AND STORAGE DEVICE INCLUDING THE SAME

CROSS-REFERENCE TO RELATED APPLICATION

This U.S. non-provisional patent application claims priority under 35 USC § 119 to Korean Patent Application No. 10-2017-0177848, filed on Dec. 22, 2017, in the Korean Intellectual Property Office (KIPO), the disclosure of which is incorporated herein in its entirety by reference.

BACKGROUND

Some embodiments relate generally to memory devices, and more particularly to nonvolatile memory devices, methods of operating nonvolatile memory devices and storage devices including the same.

Semiconductor memory devices may be volatile or nonvolatile. Flash memory devices are typically nonvolatile semiconductor memory devices. Flash memory devices may be used as a voice and image data storing medium for information appliances, such as a computer, a cellular phone, a PDA, a digital camera, a handheld PC, and the like.

Nonvolatile memory devices having memory cells that are stacked in three dimensions have been researched to improve integrity of the nonvolatile memory devices. However, increases in storage capacity may cause various problems that do not match existing memory management policies.

SUMMARY

According to some embodiments, a nonvolatile memory device includes a memory cell array and a control circuit. The memory cell array includes a plurality of memory blocks, each of plurality of the memory blocks includes a plurality of memory cells coupled to word-lines respectively, the word-lines are stacked vertically on a substrate, and some memory cells of the plurality of memory cells are selectable by sub-block unit smaller than one memory block. The control circuit divides sub-blocks of a first memory block of the plurality of memory blocks into at least one bad sub-block and at least one normal sub-block based on error occurrence frequency of each of the sub-blocks of the first memory block, and applies different program/erase cycles to the at least one bad sub-block and the at least one normal sub-block based on a command and an address provided from external to the nonvolatile memory device. The at least one bad sub-block is adjacent the at least one normal sub-block.

According to some embodiments, a nonvolatile memory device includes a memory cell array including a plurality of memory blocks, each of the memory blocks includes a plurality of memory cells coupled to word-lines respectively, the word-lines are stacked vertically on a substrate, and some memory cells of the plurality of memory cells being selected by sub-block unit smaller than one memory block. In a method of operating the nonvolatile memory device, sub-blocks of a first memory block of the plurality of memory blocks are divided into at least one bad sub-block and at least one normal sub-block based on error occurrence frequency of each of the sub-blocks of the first memory block and the at least one bad sub-block and the at least one normal sub-block are adjacent to each other. Different program/erase cycles are applied to the at least one bad sub-block and the at least one normal sub-block based on a command and an address provided from an outside.

According to some embodiments, a storage device includes at least one nonvolatile memory device and a memory controller that control the at least one nonvolatile memory device. The at least one memory device includes a memory cell array and a control circuit. The memory cell array includes a plurality of memory blocks, each of the memory blocks includes a plurality of memory cells coupled to word-lines respectively, the word-lines are stacked vertically on a substrate, and some memory cells of the plurality of memory cells are selected by sub-block unit smaller than one memory block. The control circuit controls access on the memory cell array based on a command and an address provided from the memory controller. The memory controller transmits, to the at least one nonvolatile memory device, bad sub-block information associated with bad sub-block included in each of the memory blocks. The control circuit divides sub-blocks of a first memory block of the plurality of memory blocks into at least one bad sub-block and at least one normal sub-block based on error occurrence frequency of each of the sub-blocks of the first memory block, and applies different program/erase cycles to the at least one bad sub-block and the at least one normal sub-block during a memory operation on the first memory block. The at least one bad sub-block is adjacent the at least one normal sub-block.

Accordingly, the nonvolatile memory device may divide sub-blocks of a first memory block into at least one bad sub-block and at least one normal sub-block based on error occurrence frequency of each of the sub-blocks or based on endurance characteristic due to positions of the sub-blocks, may apply different program/erase cycles to the at least one bad sub-block and the at least one normal sub-block and may apply adjust bias condition to the first memory block during a memory operation of the first memory block. Therefore, the nonvolatile memory device may enhance performance and prevent reduction of a lifetime of the nonvolatile memory device.

BRIEF DESCRIPTION OF THE DRAWINGS

Illustrative, non-limiting example embodiments will be more clearly understood from the following detailed description in conjunction with the accompanying drawings.

DETAILED DESCRIPTION

Figure 1:
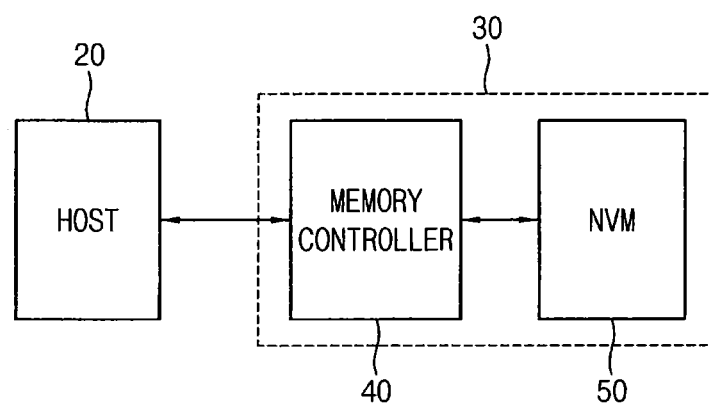
FIG. 1 is a block diagram illustrating an electronic device according to exemple embodiments of the present inventive concept.

It is noted that aspects of the inventive concept described with respect to one embodiment, may be incorporated in a different embodiment although not specifically described relative thereto. That is, all embodiments and/or features of any embodiment can be combined in any way and/or combination. These and other objects and/or aspects of the present inventive concept are explained in detail in the specification set forth below.

Various some embodiments will be described more fully hereinafter with reference to the accompanying drawings, in which some embodiments are shown.

The embodiments are described, and illustrated in the drawings, in terms of functional blocks, units and/or modules. These blocks, units and/or modules may be physically implemented by electronic (or optical) circuits such as logic circuits, discrete components, microprocessors, hard-wired circuits, memory elements, wiring connections, and the like, which may be formed together in a single integrated circuit (e.g., as a single semiconductor chip) or as separate integrated circuits and/or discrete components (e.g., several semiconductor chips wired together on a printed circuit board) using semiconductor fabrication techniques and/or other manufacturing technologies. These blocks, units and/or modules may be implemented by a processor (e.g., a microprocessor, a controller, a CPU, a GPU) or processors that are programmed using software (e.g., microcode) to perform various functions discussed herein. Each block, unit and/or module may be implemented by dedicated hardware, or as a combination of dedicated hardware to perform some functions and a processor to perform other functions. Also, each block, unit and/or module of the embodiments may be embodied by physically separate circuits and need not be formed as a single integrated. As used herein, the term "and/or" includes any and all combinations of one or more of the associated listed items. Expressions such as "at least one of," when preceding a list of elements, modify the entire list of elements and do not modify the individual elements of the list.

FIG. 1 is a block diagram illustrating an electronic device according to some embodiments.

Referring to FIG. 1, an electronic device 10 may include a host 20 and a storage device (or, a memory system) 30. The storage device 30 may include a memory controller 40 and at least one nonvolatile memory device 50. The host 20 may control overall operation of the storage device 30.

The memory controller 40 may exchange the signals such as a command, an address, data, etc. with the host 20. The memory controller 40 may write data in the nonvolatile memory device 50 and reads data from the nonvolatile memory device 50 according to a command from the host 20.

Figure 2:
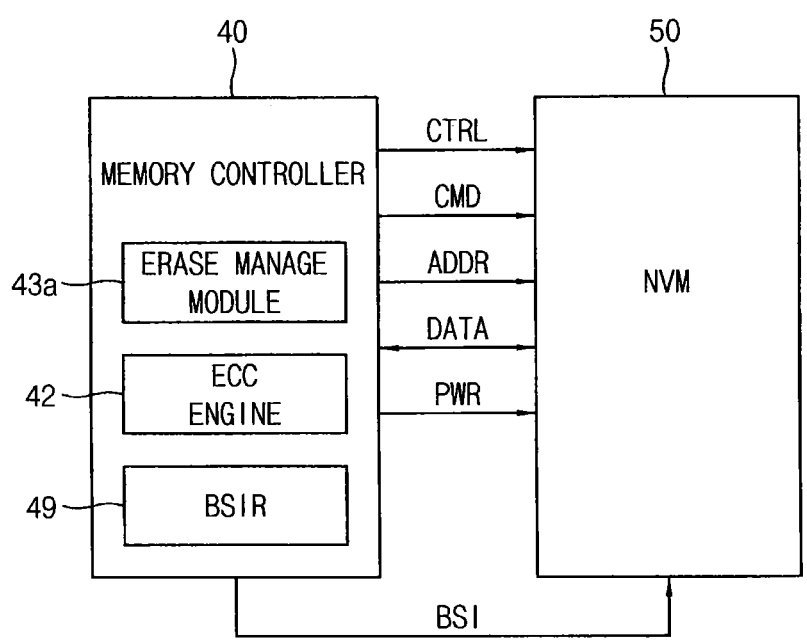
FIG. 2 is a block diagram illustrating the storage device in FIG. 1 according to example embodiments of the present inventive concept.

FIG. 2 is a block diagram illustrating the storage device in FIG. 1 according to some embodiments.

Referring to FIG. 2, the storage device 30 may include the memory controller 40 and the at least one nonvolatile memory device 50.

In some embodiments, each of the memory controller 40 and the nonvolatile memory device 50 may be provided in the form of a chip, a package, or a module. In some embodiments, the memory controller 40 and the nonvolatile memory device 50 may be mounted on various packages to be provided as a storage device such as a memory card.

The nonvolatile memory device 50 may perform a read operation, an erase operation, a program operation or a write operation under control of the memory controller 40. The nonvolatile memory device 50 receives a command CMD, an address ADDR and data DATA through input/output lines from the memory controller 40 for performing such operations. In addition, the nonvolatile memory device 50 receives a control signal CTRL through a control line from the memory controller 40. In addition, the nonvolatile memory device 50 receives a power PWR through a power line from the memory controller 40.

Memory cells of the nonvolatile memory device 50 may have the physical characteristic that a threshold voltage distribution varies due to causes, such as a program elapsed time, a temperature change or reading, program disturbance, read disturbance, etc. For example, data stored at the nonvolatile memory device 50 may become erroneous due to the above causes. The memory controller 40 may utilize a variety of error correction techniques to correct such errors. For example, the memory controller 40 may include an error correction code (ECC) engine 42.

The memory controller 40 may perform an erase operation on the nonvolatile memory device 50 by sub-block unit and the sub-block is smaller than one memory block of the nonvolatile memory device 50. As an example, one memory block may include a plurality of sub-blocks. The memory controller 40 may include an erase manage module 43a to manage the erase operation by sub-block unit.

After a sub-block erase operation, the erase manage module 43a may check an erase status of an erased sub-block and/or a sub-block adjacent to the erased sub-block. For example, the erase manage module 43a may sense memory cells of the erased sub-block to determine whether specific parameters exceed a reference cycle value. The erase manage module 43a may read data of sub-block(s) adjacent to the erased sub-block to detect erase-inhibition efficiency. For example, the erase manage module 43a may detect bit error rate (BER) based on data read from an erased sub-block. The erase manage module 43a may acquire and monitor wear-leveling information (e.g., erase count) on the erased sub-block. In addition, the erase manage module 43a may read data of the erased sub-block to monitor a variation in threshold voltages of selected memory cells and/or a variation in the bit error rate (BER). The erase manage module 43a may also read data of an unselected sub-block to detect a variation in a threshold voltage. The memory controller 40 may perform various procedures for compensating for insufficient erasing of a selected sub-block based on erase status information detected by the erase manage module 43a.

Generally, a memory block may be a maximum size of a memory unit that may be erased at the same time. In a three-dimensional nonvolatile memory device, where word-lines are stacked in a direction intersecting (e.g., perpendicular to) a substrate, a memory block may be defined as a group of cell strings sharing stacked word-lines. A sub-block may correspond to a sub-memory unit defined by dividing the memory block (or, physical block) by word line unit or selection line unit. For example, each sub-block may be formed of memory cells sharing a portion of the word-lines of the memory block.

During a read operation on the nonvolatile memory device 50, the memory controller 40 may read data stored at a first page of the nonvolatile memory device 50, using a default read voltage set. The default read voltage set may include predetermined read voltages. The ECC engine 42 may detect and correct errors included in data read from the nonvolatile memory device 50. The ECC engine 42 may perform an ECC operation by detecting and correcting errors. In some embodiments, the ECC engine 42 may be implemented in the form of hardware. The ECC engine 42 may determine error occurrence frequency in the read data from the nonvolatile memory device 50 by unit of sub-block and may designate a sub-block as a bad sub-block, whose error occurrence frequency is greater than a reference cycle value during a predetermined time.

The memory controller 40 may include a bad sub-block information register 49 that stores information of at least one bad sub-block of the sub-blocks and may provide the nonvolatile memory device 50 with bad sub-block information including bad sub-block addresses of the bad sub-block.

Figure 3:
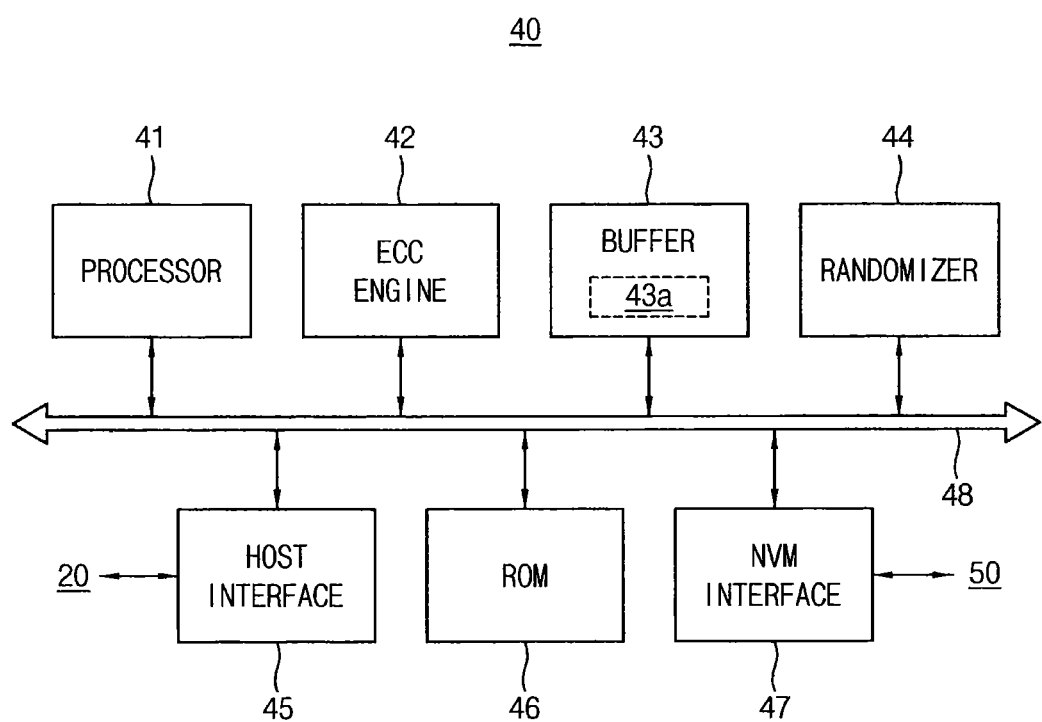
FIG. 3 is a block diagram illustrating the memory controller in the storage device of FIG. 2 according to example embodiments of the present inventive concept.

FIG. 3 is a block diagram illustrating the memory controller in the storage device of FIG. 2 according to some embodiments.

Referring to FIGS. 2 and 3, the memory controller 40 may include a processor 41, the ECC engine 42, the buffer 43, the erase manage module 43a that may be associated with the buffer 43, a randomizer 44, a host interface 45, a read only memory (ROM) 46, and a nonvolatile memory interface 47 which are connected via a bus 48. The ECC engine 42, and the erase manage module 43a are described with reference to FIG. 2, and a description thereof is thus omitted.

The processor 41 controls an overall operation of the memory controller 40. In some embodiments, the erase manage module 43a may be implemented in software and stored in the buffer 43. The erase manage module 43a stored in the buffer 43 may be driven by the processor 41. The ROM 46 may store a variety of information needed for the memory controller 40 to operate, in firmware. The buffer 43 may store data provided from the nonvolatile memory device 50 and may include the erase manage module 43a.

The randomizer 44 may randomize data to be stored in the nonvolatile memory device 50. For example, the randomizer 44 may randomize data to be stored in the nonvolatile memory device 50 in a unit of a word-line.

Data randomizing may be performed to process data such that program states of memory cells connected to a word-line have the same ratio. For example, if memory cells connected to one word-line are multi-level cells (MLC) each storing 2-bit data, each of the memory cells has one of an erase state and first through third program states. In this case, the randomizer 44 randomizes data such that in memory cells connected to one word-line, the number of memory cells having the erase state, the number of memory cells having the first program state, the number of memory cells having the second program state, and the number of memory cells having the third program state are substantially the same as one another. For example, memory cells in which randomized data is stored have program states of which the number is equal to one another. The randomizer 44 de-randomizes data read from the nonvolatile memory device 50. It will be understood that, although the terms first, second, third, etc. may be used herein to describe various elements, elements should not be limited by these terms; rather, these terms are only used to distinguish one element from another element. Thus, a first element discussed below could be termed a second element without departing from the scope of the present inventive concepts.

The randomizer 44 may randomize page data. For the sake of easy understanding, an ideal operation of the randomizer 44 is described. However, the inventive concept is not limited thereto. For example, the randomizer 44 randomizes data such that in memory cells connected to one word-line, the number of memory cells having the erase state, the number of memory cells having the first program state, the number of memory cells having the second program state, and the number of memory cells having the third program state are approximately the same value. For example, memory cells in which randomized data is stored have program states of which the number is similar to one another.

The memory controller 40 communicates with the host 20 through the host interface 45. For example, the host interface 45 may include Universal Serial Bus (USB), Multimedia Card (MMC), embedded-MMC, peripheral component interconnection (PCI), PCI-express, Advanced Technology Attachment (ATA), Serial-ATA, Parallel-ATA, small computer small interface (SCSI), enhanced small disk interface (ESDI), Integrated Drive Electronics (IDE), Mobile Industry Processor Interface (MIPI), Nonvolatile memory express (NVMe), Universal Flash Storage (UFS), and etc. The memory controller 40 communicates with the nonvolatile memory device 50 through the nonvolatile memory interface 47.

Figure 4:
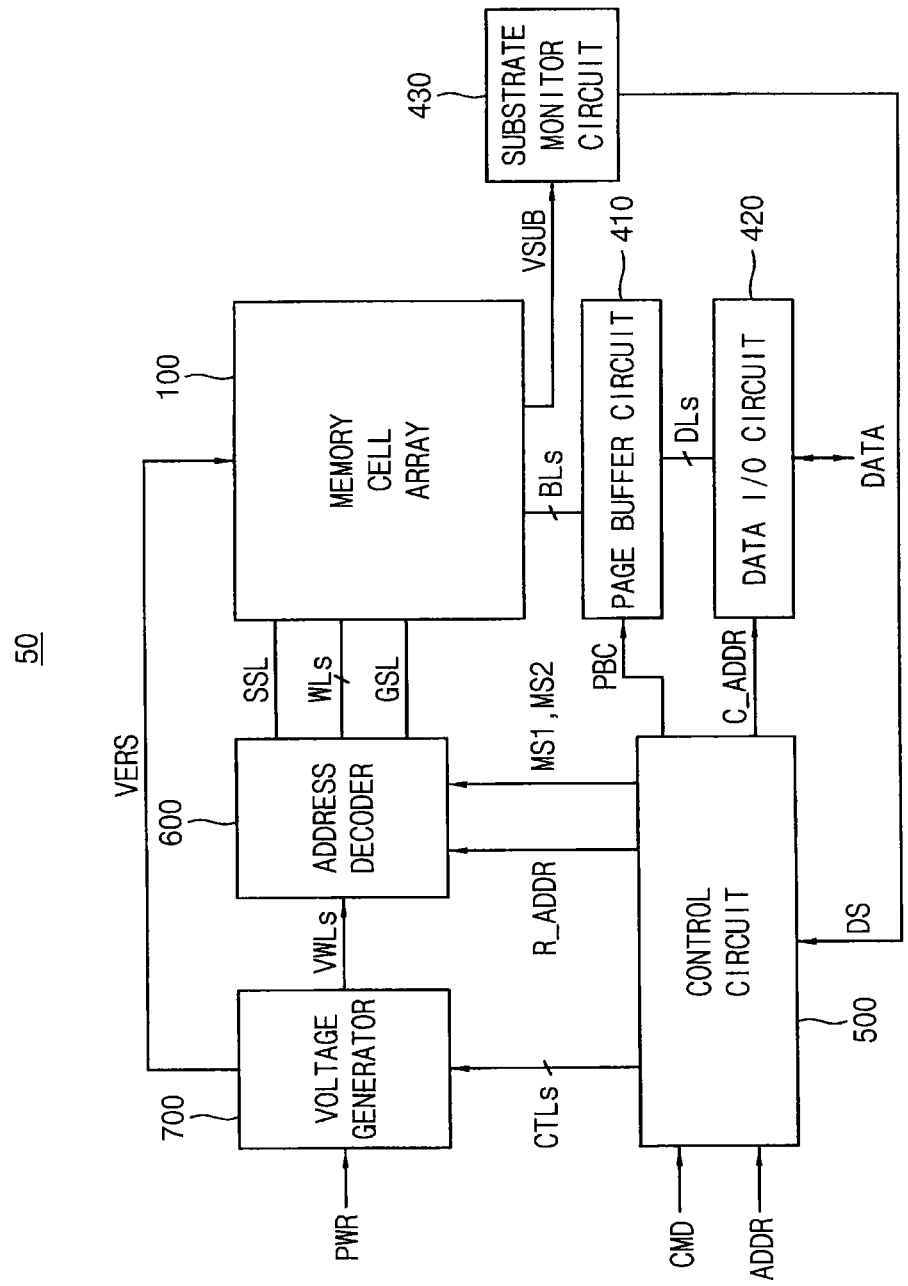
FIG. 4 is a block diagram illustrating the nonvolatile memory device in the storage device of FIG. 2 according to example embodiments of the present inventive concept.

FIG. 4 is a block diagram illustrating the nonvolatile memory device in the storage device of FIG. 2 according to some embodiments.

Referring to FIG. 4, the nonvolatile memory device 50 includes a memory cell array 100, an address decoder 600, a page buffer circuit 410, a data input/output circuit 420, a substrate monitor circuit 430, a control circuit 500 and a voltage generator 700.

The memory cell array 100 may be coupled to the address decoder 600 through a string selection line SSL, a plurality of word-lines WLs, and/or a ground selection line GSL. In addition, the memory cell array 100 may be coupled to the page buffer circuit 410 through a plurality of bit-lines BLs. The memory cell array 100 may include a plurality of memory cells coupled to the plurality of word-lines WLs and the plurality of bit-lines BLs.

The address decoder 600 may transfer voltages to the string selection line SSL, the plurality of word-lines WLs, and/or the ground selection line GSL for operating memory cells of the memory cell array 100 in response to an address ADDR and a command CMD received from the memory controller 40 by receiving various word-line voltages VWLs from the voltage generator 700. The voltage generator 700 may provide the word-line voltages VWLs to the address decoder 600 and an erase voltage VERS to the memory cell array 100 in response to control signals CTLs received from the control circuit 500.

Figure 5:
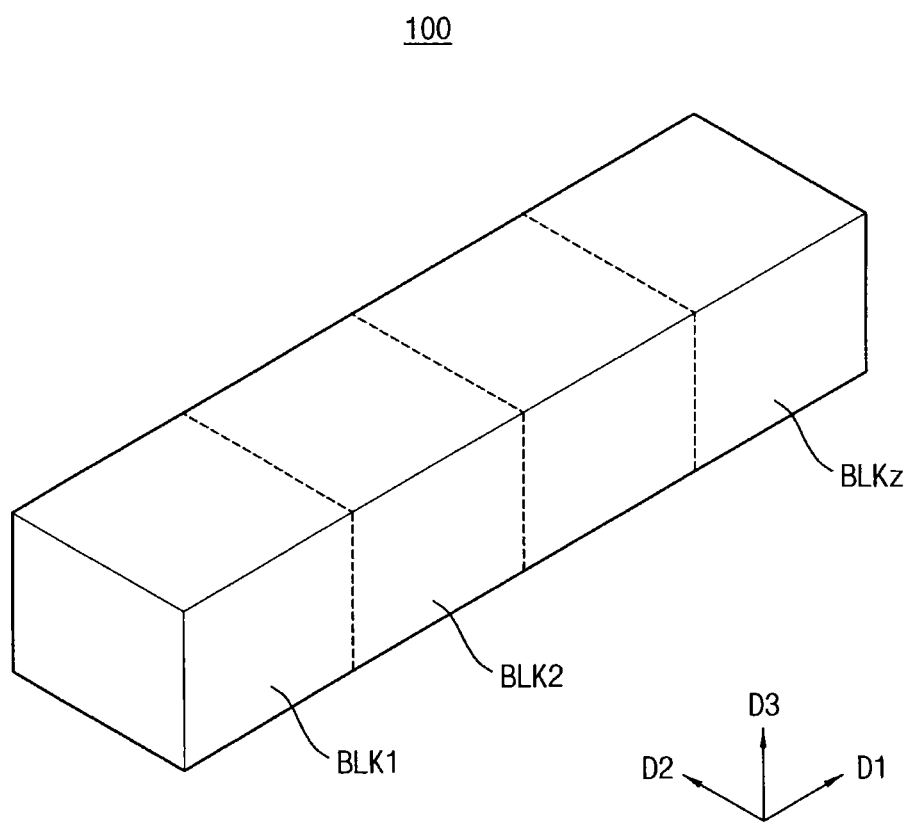
FIG. 5 is a block diagram illustrating the memory cell array in FIG. 4 according to example embodiments of the present inventive concept.

FIG. 5 is a block diagram illustrating the memory cell array in FIG. 4 according to some embodiments.

Referring to FIG. 5, the memory cell array 100 may include a plurality of memory blocks BLK1 to BLKz that extend in first through third directions D1, D2 and D3. In an embodiment, the memory blocks BLK1 to BLKz are selected by the address decoder 600 in FIG. 4. For example, the address decoder 600 may select a memory block BLK corresponding to a block address among the memory blocks BLK1 to BLKz. The address decoder 600 may select at least one sub-block in one memory block in response to a row address R_ADDR.

Figure 6:
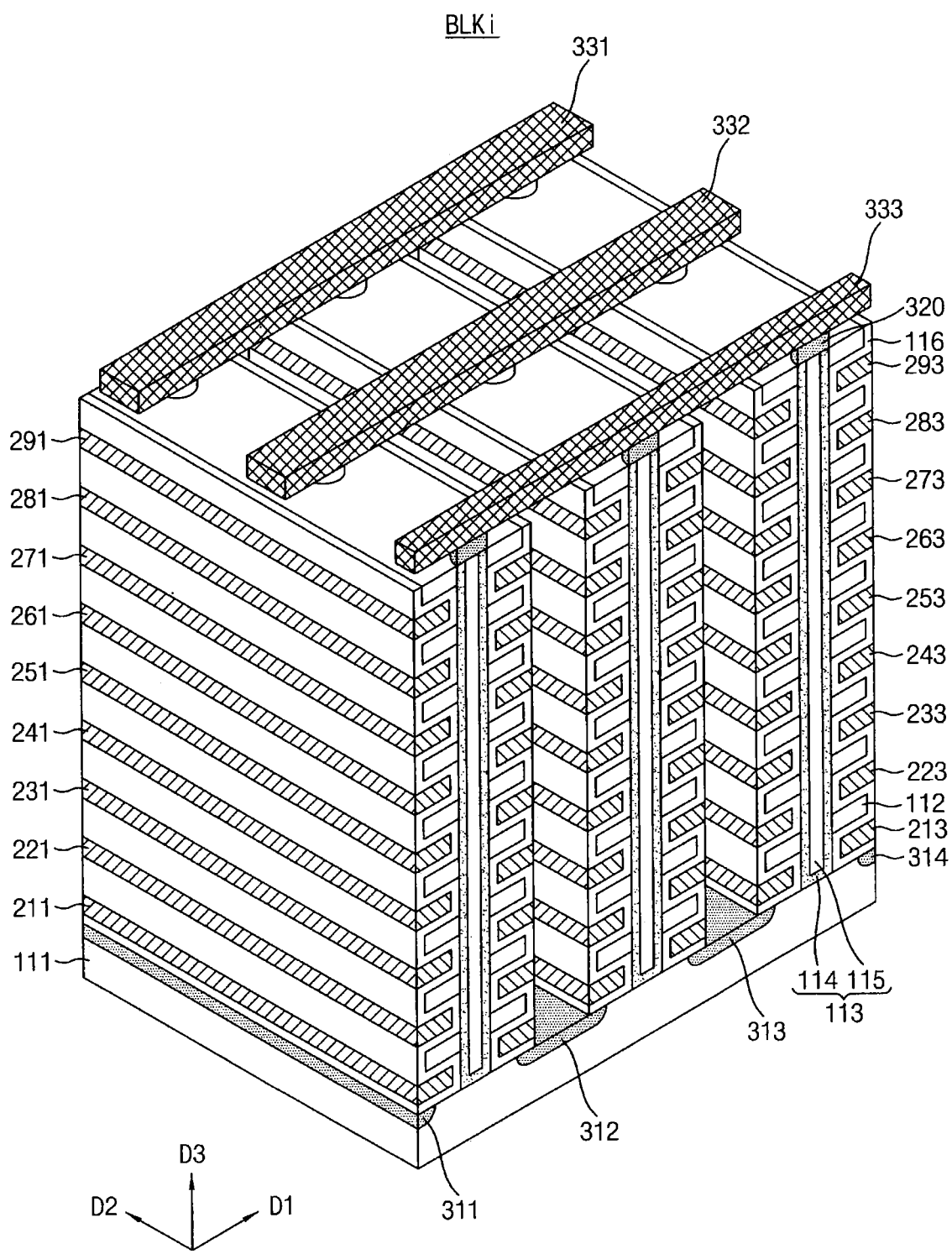
FIG. 6 is a perspective view illustrating one of the memory blocks of FIG. 5 according to example embodiments of the present inventive concept.

FIG. 6 is a perspective view illustrating one of the memory blocks of FIG. 5 according to some embodiments.

Referring to FIG. 6, a memory block BLKa includes structures extending along the first to third directions D1~D3.

A substrate 111 is provided. For example, the substrate 111 may have a well of a first type (e.g., a first conductive type). For example, the substrate 111 may have a p-well formed by implanting a group 3 element such as boron (B). For example, the substrate 111 may have a pocket p-well provided in an n-well. In an embodiment, the substrate 111 has a p-type well (or a p-type pocket well). However, the conductive type of the substrate 111 is not limited to the p-type.

A plurality of doping regions 311 to 314 extending along the first direction D1 are provided in/on the substrate 111. For example, the plurality of doping regions 311 to 314 may have a second type (e.g., a second conductive type) different from the first type of the substrate 111. In some embodiments, the first to fourth doping regions 311 to 314 have an n-type. However, the conductive type of the first to fourth doping regions 311 to 314 is not limited to the n-type.

A plurality of insulation materials 112 extending along the second direction D2 are sequentially provided along the third direction D3 on a region of the substrate 111 between the first and second doping regions 311 and 312. For example, the plurality of insulation materials 112 are provided along the third direction D3, being spaced by a specific distance. For example, the insulation materials 112 may include an insulation material such as an oxide layer.

A plurality of pillars 113 penetrating the insulation materials along the third direction D3 are sequentially disposed along the second direction D2 on a region of the substrate 111 between the first and second doping regions 311 and 312. For example, the plurality of pillars 113 penetrates the insulation materials 112 to contact the substrate 111.

For example, each pillar 113 may include a plurality of materials. For example, a channel layer 114 of each pillar 113 may include a silicon material having a first type. For example, the channel layer 114 of each pillar 113 may include a silicon material having the same type as the substrate 111. In some embodiments, the channel layer 114 of each pillar 113 may include a p-type silicon. However, the channel layer 114 of each pillar 113 is not limited to the p-type silicon.

An inner material 115 of each pillar 113 includes an insulation material. For example, the inner material 115 of each pillar 113 may include an insulation material such as a silicon oxide. For example, the inner material 115 of each pillar 113 may include an air gap.

An insulation layer 116 is provided along the exposed surfaces of the insulation materials 112, the pillars 113, and the substrate 111, on a region between the first and second doping regions 311 and 312. For example, the insulation layer 116 provided on the exposed surface in the third direction D3 of the last insulation material 112 may be removed.

A plurality of first conductive materials 211 to 291 is provided between second doping regions 311 and 312 on the exposed surfaces of the insulation layer 116. For example, the first conductive material 211 extending along the second direction D2 is provided between the substrate 111 and the insulation material 112 adjacent to the substrate 111.

A first conductive material extending along the first direction D1 is provided between the insulation layer 116 at the top of a specific insulation material among the insulation materials 112 and the insulation layer 116 at the bottom of a specific insulation material among the insulation materials 112. For example, a plurality of first conductive materials 221 to 281 extending along the first direction D1 are provided between the insulation materials 112 and it may be understood that the insulation layer 116 is provided between the insulation materials 112 and the first conductive materials 221 to 281. The plurality of first conductive materials 211 to 291 may include a metal material. The plurality of first conductive materials 211 to 291 may include a conductive material such as a polysilicon.

Similar structures as those on the first and second doping regions 311 and 312 may be provided in a region between the second and third doping regions 312 and 313. In the region between the second and third doping regions 312 and 313, provided are a plurality of insulation materials 112 extending along the first direction D1, a plurality of pillars 113 disposed sequentially along the first direction D1 and penetrating the plurality of insulation materials 112 along the third direction D3, an insulation layer 116 provided on the exposed surfaces of the plurality of insulation materials 112 and the plurality of pillars 113, and a plurality of third conductive materials 213 to 293 extending along the first direction D1.

In a region between the third and fourth doping regions 313 and 314, similar structures as those on the first and second doping regions 311 and 312 may be provided. In the region between the third and fourth doping regions 313 and 314, provided are a plurality of insulation materials 112 extending along the first direction D1, a plurality of pillars 113 disposed sequentially along the first direction D1 and not penetrating the plurality of insulation materials 112 along the third direction D3, an insulation layer 116 provided on the exposed surfaces of the plurality of insulation materials 112 and the plurality of pillars 113, and a plurality of third conductive materials 213 to 293 extending along the first direction D1.

Drains 320 are provided on the plurality of pillars 113, respectively. On the drains, the second conductive materials 331 to 333 extending along the first direction D1 are provided. The second conductive materials 331 to 333 are disposed along the second direction D2, being spaced by a specific distance. The second conductive materials 331 to 333 are respectively connected to the drains 320 in a corresponding region. The drains 320 and the second conductive material 333 extending along the first direction D1 may be connected through respective contact plugs.

Figure 7:
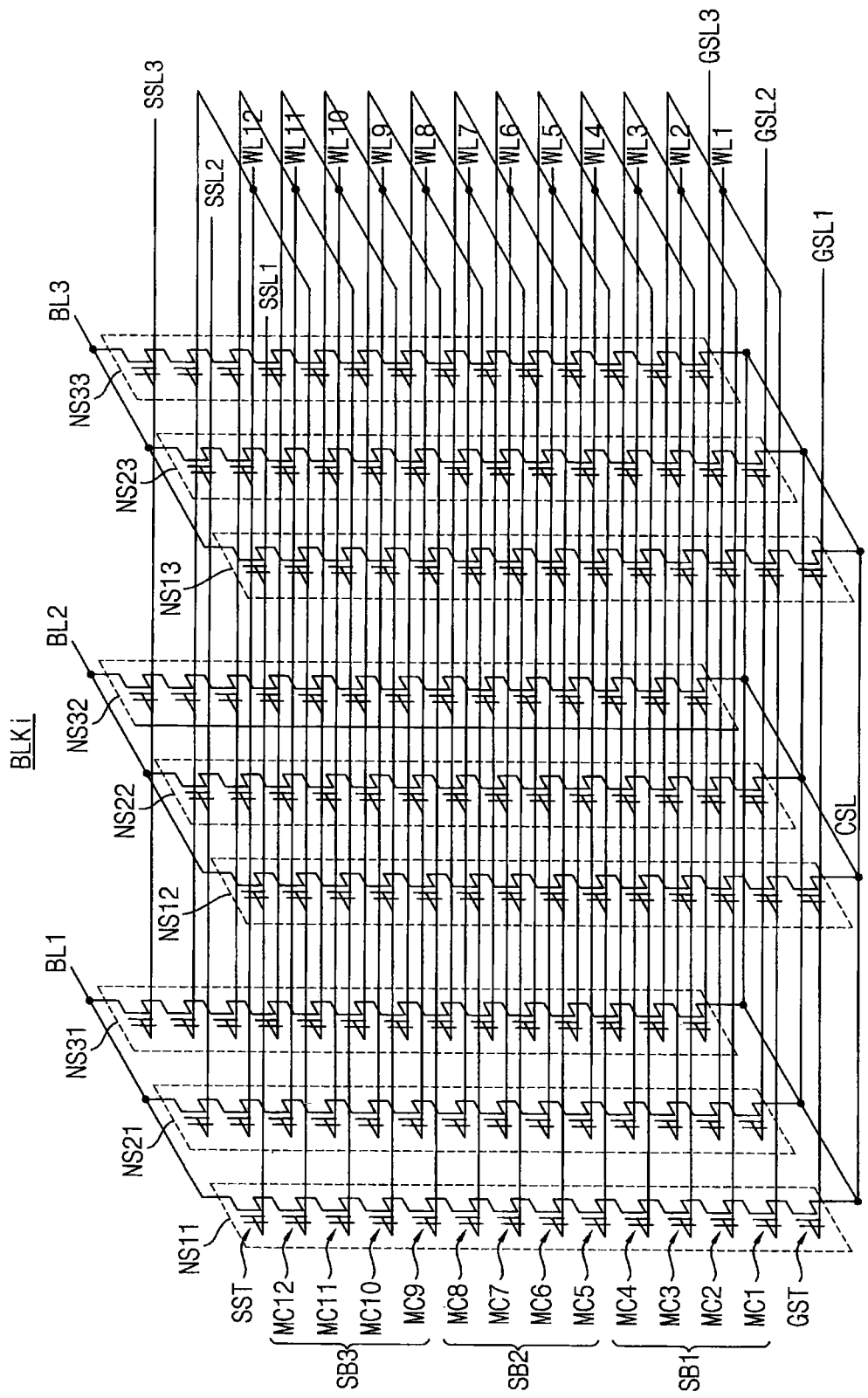
FIG. 7 is an equivalent circuit diagram illustrating the memory block of FIG. 6 according to example embodiments of the present inventive concept.

FIG. 7 is an equivalent circuit diagram illustrating the memory block of FIG. 6 according to some embodiments.

The memory block BLKi of FIG. 7 may be formed on a substrate in a three-dimensional structure (or a vertical structure). For example, a plurality of memory cell strings included in the memory block BLKi may be formed in a direction perpendicular to the substrate.

Referring to FIG. 7, the memory block BLKi may include memory cell strings NS11 to NS33 coupled between bit-lines BL1, BL2 and BL3 and a common source line CSL. Each of the memory cell strings NS11 to NS33 may include a string selection transistor SST, a plurality of memory cells MC1 to MC12, and a ground selection transistor GST. In FIG. 7, each of the memory cell strings NS11 to NS33 is illustrated to include twelve memory cells MC1 to MC12. However, some embodiments are not limited thereto. In some embodiments, each of the memory cell strings NS11 to NS33 may include any number of memory cells.

The string selection transistor SST may be connected to corresponding string selection lines SSL1 to SSL3. The plurality of memory cells MC1 to MC12 may be connected to corresponding word-lines WL1 to WL12, respectively. The ground selection transistor GST may be connected to corresponding ground selection lines GSL1 to GSL3. The string selection transistor SST may be connected to corresponding bit-lines BL1, BL2 and BL3, and the ground selection transistor GST may be connected to the common source line CSL.

In example embodiments, dummy memory cells connected to a dummy word-line (not shown) may be coupled between the string selection transistor SST and the memory cell MC12 and/or coupled between the ground selection transistor GST and the memory cell MC1. For example, dummy memory cells may be simultaneously formed with normal memory cells with the same processes. A dummy memory cell may be activated by a dummy word-line, but may not have any "data" stored to read from a device external. For instance, data stored in a dummy memory cell electrically connected to a dummy word-line may not be transmitted outside of the memory cell array through selection signals provided by the column decoder, as is sometimes the case for normal memory cells. For instance, a dummy memory cell electrically connected to a dummy word-line may not have a connection to a bit line to transmit data therebetween as with normal memory cells.

Word-lines (e.g., WL1) having the same height may be commonly connected, and the ground selection lines GSL1 to GSL3 and the string selection lines SSL1 to SSL3 may be separated. In FIG. 7, the memory block BLKa is illustrated to be coupled to twelve word-lines WL1 to WL12 and three bit-lines BL1 to BL3. However, some embodiments are not limited thereto. In some embodiments, the memory cell array 100 may be coupled to any number of word-lines and bit-lines.

According to some embodiments, the memory block BLKi is divided into a plurality of sub-blocks, indicated by representative sub-blocks SB1, SB2, and SB3, each sub-block being smaller in size than the memory block BLKi. The sub-blocks SB1, SB2 and SB3 may be divided in a word-line direction, as shown in FIG. 7. In some embodiments, the sub-blocks SB1, SB2 and SB3 may be divided on the basis of bit-lines or string selection lines. The sub-blocks SB1, SB2 and SB3 in the memory block BLKa may be erased independently of the reference used to divide the memory block BLKa into sub-blocks.

For example, the sub-block SB1 includes memory cells coupled to the word-lines WL1, WL2, WL3 and WL4, the sub-block SB2 includes memory cells coupled to the word-lines WL5, WL6, WL7 and WL8, and the sub-block SB3 includes memory cells coupled to the word-lines WL9, WL10, WL11 and WL12, from among the memory cells included in the memory block BLKa. The memory cells included in the sub-block SB1 may be selected and erased independently of the remaining sub-blocks SB2 and SB3, and vice versa. One or more of the sub-blocks SB1, SB2, and SB3 may be selected and erased at the same time or at different times. The address decoder 600 of the nonvolatile memory device 50 (refer to FIG. 4) may provide a bias for erasing memory cells by sub-block unit.

Referring back to FIG. 4, the control circuit 500 may receive the command (signal) CMD and the address (signal) ADDR from the memory controller 40 and control an erase operation, a program operation and a read operation of the nonvolatile memory device 50 based on the command signal CMD and the address signal ADDR.

In example embodiments, the control circuit 500 of FIG. 4 may generate the control signals CTLs, which are used for controlling the voltage generator 700, and may generate the page buffer control signal PBC for controlling the page buffer circuit 410, based on the command signal CMD, and generate a row address R_ADDR and a column address C_ADDR based on the address signal ADDR. The control circuit 500 of FIG. 4 may provide the row address R_ADDR to the address decoder 600 and provide the column address C_ADDR to the data input/output circuit 420. In addition, the control circuit 500 may provide the address decoder 600 with a first mode signal MS1 in response to a detection signal DS provided from the substrate monitor circuit 430. The first mode signal MS1 indicates that a voltage level of the substrate 111 reaches a reference level or indicates that the voltage level of the substrate 111 is maintained at a constant level during a reference time interval. In addition, the control circuit 500 may provide the address decoder 600 with a second mode signal MS2 indicating operation designated by the command SMD.

The address decoder 600 of FIG. 4 may be coupled to the memory cell array 100 through the string selection line SSL, the plurality of word-lines WLs, and the ground selection line GSL. The voltage generator 700 may generate the word-line voltages VWLs, which are required for the operation of the nonvolatile memory device 50, based on the control signals CTLs. The voltage generator 700 may receive the power PWR from the memory controller 40. The word-line voltages VWLs may be applied to the plurality of word-lines WLs through the address decoder 600.

For example, during the sub-block erase operation, the voltage generator 700 may apply the erase voltage VERS to a well of the memory block or the substrate 111 and may apply a word-line erase voltage (e.g., a ground voltage) to word-lines of a selected sub-block. During the erase verification operation, the voltage generator 700 may apply an erase verification voltage to the entire word-lines of the selected sub-block or sequentially apply the erase verification voltage to word-lines of the selected sub-block on a word-line basis.

For example, during the program operation, the voltage generator 700 may apply a program voltage to the selected word-line and may apply a program pass voltage to the unselected word-lines. In addition, during the program verification operation, the voltage generator 700 may apply a program verification voltage to the selected word-line and may apply a verification pass voltage to the unselected word-lines. In addition, during the read operation, the voltage generator 700 may apply a read voltage to the selected word-line and may apply a read pass voltage to the unselected word-lines.

The page buffer circuit 410 may be coupled to the memory cell array 100 through the plurality of bit-lines BLs. The page buffer circuit 410 may include a plurality of page buffers. In some embodiments, one page buffer may be connected to one bit-line. In some embodiments, one page buffer may be connected to two or more bit-lines.

The page buffer circuit 410 may temporarily store data to be programmed in a selected page or data read out from the selected page of the memory cell array 100. The page buffer circuit 410 may include a plurality of page buffers. The page buffer circuit 410 may temporarily store data to be programmed in a selected page and may temporarily store data read from the selected page.

The data input/output circuit 420 may be coupled to the page buffer circuit 410 through data lines DLs. During the program operation, the data input/output circuit 420 may receive program data DATA from the memory controller 40 and provide the program data DATA to the page buffer circuit 410 based on the column address C_ADDR received from the control circuit 500. During the read operation, the data input/output circuit 420 may provide read data DATA, which are stored in the page buffer circuit 410, to the memory controller 40 based on the column address C_ADDR received from the control circuit 500.

During the erase operation, the substrate monitor circuit 430 may monitor a voltage level of a substrate voltage (or a voltage level of the substrate 111) VSUB in response to the erase voltage VERS applied to the substrate and may provide the control circuit 500 with the detection signal DS indicating that a level of the substrate voltage VSUB reaches a reference level and/or indicating that the level of the substrate voltage VSUB is maintained at a level of the erase voltage VERS during a reference time interval.

Figure 8:
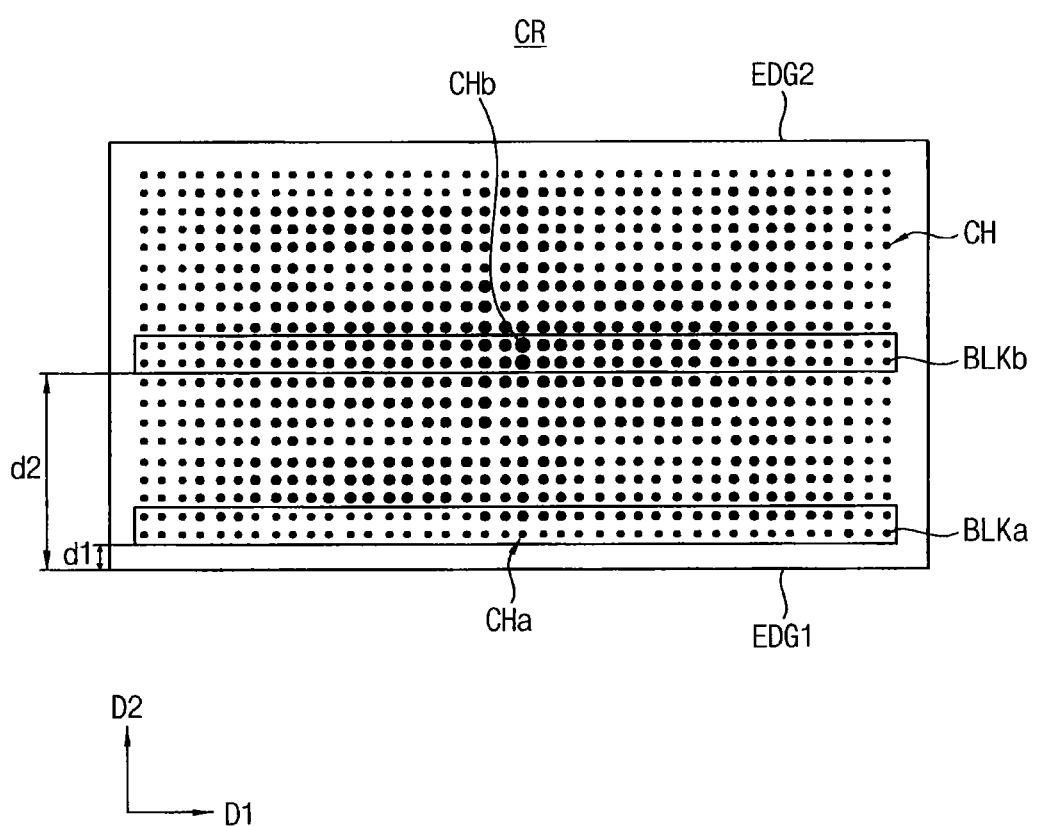
FIG. 8 illustrates a cell region in which the memory cell array of FIG. 4 is formed according to example embodiments of the present inventive concept.

FIG. 8 illustrates a cell region in which the memory cell array of FIG. 4 is formed according to some embodiments.

Referring to FIG. 8, a cell region CR includes a plurality of channel holes CH.

A channel hole size, for example, a channel hole diameter, may be varied according to positions within the cell region CR. For example, channel holes CH adjacent to the first and second edges EDG1 and EDG2 have a low peripheral density, and thus may have a different diameter from those of other channel holes CH. A memory block BLKa may be adjacent to the second edge EDG2, and may be spaced apart from the second edge EDG2 by a first distance d1. A memory block BLKb may not be adjacent to the first and second edges EDG1 and EDG2, and be in a center of the cell region CR, and may be spaced apart from the second edge EDG2 by a second distance d2. The second distance d2 may be greater than the first distance d1. A first diameter D1 of a first channel hole CHa included in the memory block BLKa may be smaller than a second diameter D2 of a second channel hole CHb included in the memory block BLKb.

Figure 9A:
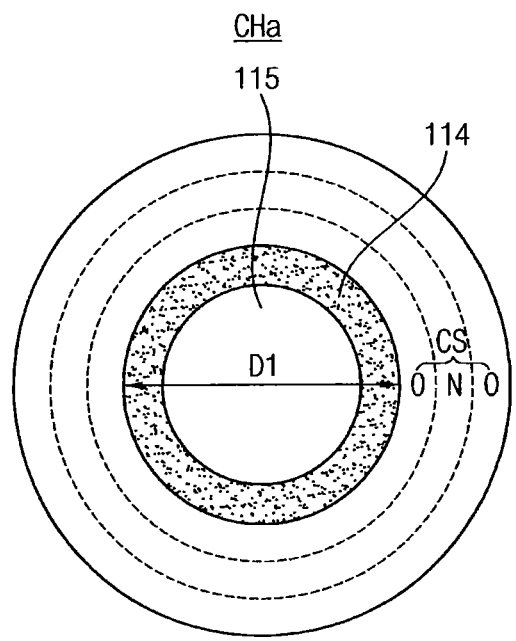
FIGS. 9A and 9B illustrate cross-sections of strings of the memory blocks of FIG. 8, respectively according to example embodiments of the present inventive concept.
Figure 9B:
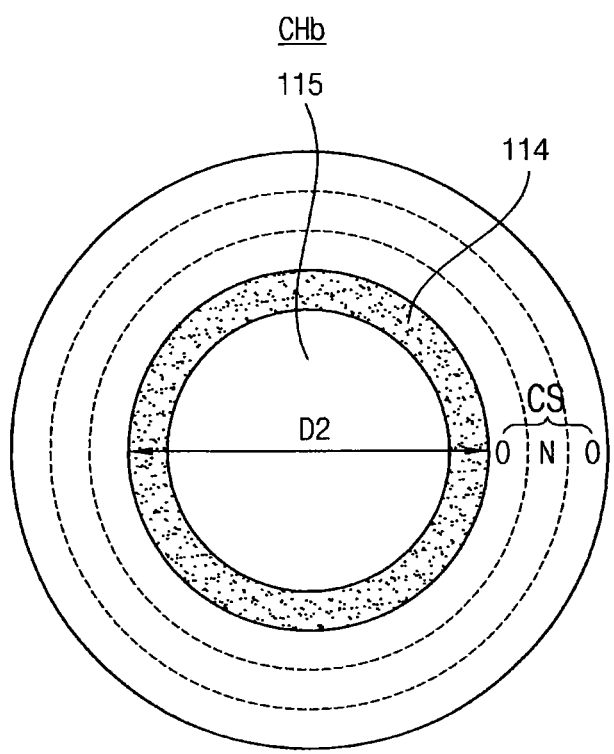

FIGS. 9A and 9B illustrate cross-sections of strings of the memory blocks BLKa and BLKb of FIG. 8, respectively.

Referring to FIG. 9A, a pillar including a channel layer 114 and an internal layer 115 may be formed in the first channel hole CHa included in the memory block BLKa, and a charge storage layer CS may be formed around the first channel hole CHa, and the charge storage layer CS may have an (oxide-nitride-oxide) ONO structure.

Referring to FIG. 9B, a pillar including a channel layer 114 and an internal layer 115 may be formed in the second channel hole CHb included in the memory block BLKb, and a charge storage layer CS may be formed around the second channel hole CHb, and the charge storage layer CS may have an ONO structure.

In an example embodiment, a thickness of the charge storage layer CS included in the memory block BLKb may be different from a thickness of the charge storage layer CS included in the memory block BLKa. Characteristics of memory cells may vary due to the difference in the channel hole diameters. For example, in a 3D memory device having a gate all around structure in which a gate electrode is disposed around a circumference of a channel hole, if a channel hole diameter is reduced, the magnitude of an electric field formed between a gate electrode (e.g., the gate electrode 211 of FIG. 6) and a channel region 114 is increased. Thus, program and erase speeds of a memory cell having a relatively small channel hole diameter like the first channel hole CHa may be higher than those of a memory cell having a relatively large channel hole diameter like the second channel hole CHb.

Referring back to FIG. 8, a memory block is formed in the cell region CR to include all memory cells corresponding to one page in the first direction D1, that is, in a word-line direction, and to include some strings in the second direction D2, that is, in a bit-line direction. Thus, each memory block extends in the first direction D1, and channel hole sizes, that is, channel hole diameters may differ in units of memory blocks. Thus, program and erase speeds of memory cells included in the memory block BLKa may be higher than program and erase speeds of memory cells included in the memory block BLKb.

Figure 10:
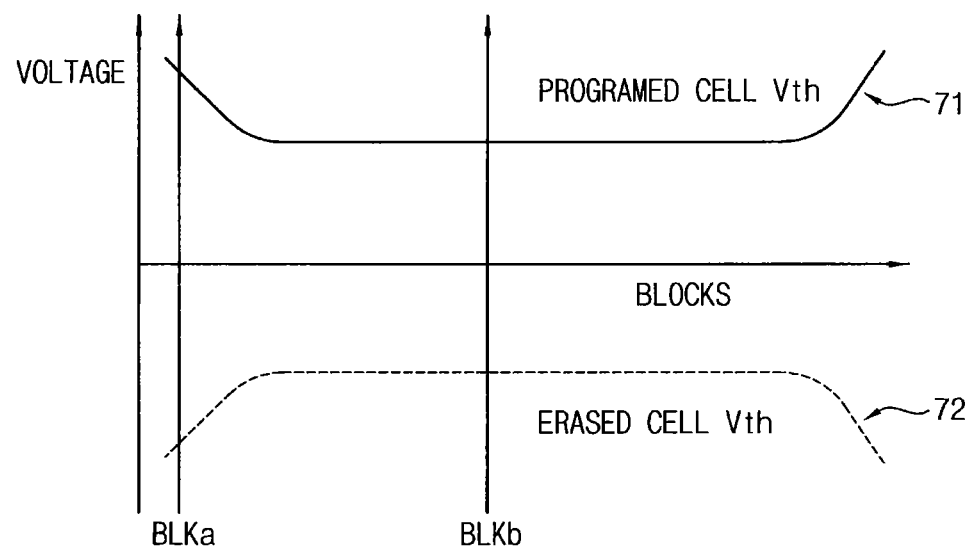
FIG. 10 is a graph showing a result of performing a program operation and an erase operation on the memory blocks in FIG. 8 according to example embodiments of the present inventive concept.

FIG. 10 is a graph showing a result of performing a program operation and an erase operation on the memory blocks in FIG. 8.

Referring to FIG. 10, a horizontal axis denotes position of memory blocks in the second direction D2, that is, a bit-line direction, and a vertical axis denotes a threshold voltage. For example, a solid line 71 denotes a central value of threshold voltages according to memory block positions of a programmed memory cell, and a dotted line 72 denotes a central value of threshold voltages according to memory block positions of an erased memory cell. A number of word-lines included in the at least one bad sub-block varies according to a position at which the first memory block is formed in the memory cell array.

As described above, the threshold voltage distribution, as indicated by the solid line 71, of programmed memory cells may have a U shape. As indicated by the U-shaped graph, programming of memory cells at memory block positions nearer an upper and/or lower edge of the memory device may need a higher threshold voltage. In addition, the threshold voltage distribution, as indicated by the dotted line 72, of erased memory cells may have an inverted U. As indicated by the inverted U-shaped graph, erasing of memory cells at memory block positions nearer an upper and/or lower edge of the memory device may need a lower threshold voltage.

Figure 11:
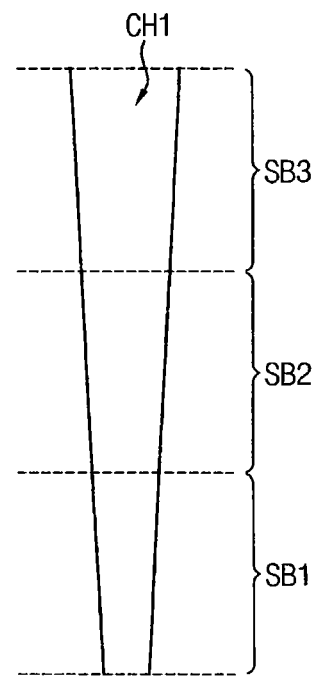
FIG. 11 illustrates an example of a vertical structure in FIG. 8 according to example embodiments of the present inventive concept.

FIG. 11 illustrates an example of a vertical structure in FIG. 8.

Referring to FIG. 11, a channel hole CH1 corresponding to a string included in a 3D memory device is illustrated. As described above, the channel hole CH1 is formed by etching portions of gate electrodes and insulation layers stacked on a substrate, and thus, the channel hole CH1 may be a tapered etching profile where a diameter of the channel hole CH1 is becoming downwardly smaller. Thus, a diameter of the channel hole CH1 may be smaller towards the substrate.

In some embodiments, the channel hole CH1 may be divided into three zones according to channel hole diameters. For example, a zone in which a channel hole diameter is smaller than a first value may be referred to as a first zone, and a zone in which a channel hole diameter is equal to or greater than the first value and smaller than a second value may be referred to as a second zone, and a zone in which a channel hole diameter is equal to or greater than the second value and smaller than a third value may be referred to as a third zone. The first zone corresponds to the sub-block SB1, the second zone corresponds to the sub-block SB2 and the third zone corresponds to the sub-block SB3. Therefore, memory cells in one channel hole may have different characteristics due to difference of diameters of the channel hole according to positions of sub-blocks. Therefore, program and erase speeds of memory cells included in one channel hole may be different according to positions of sub-blocks, as indicated in the graph of FIG. 10.

Figure 12:
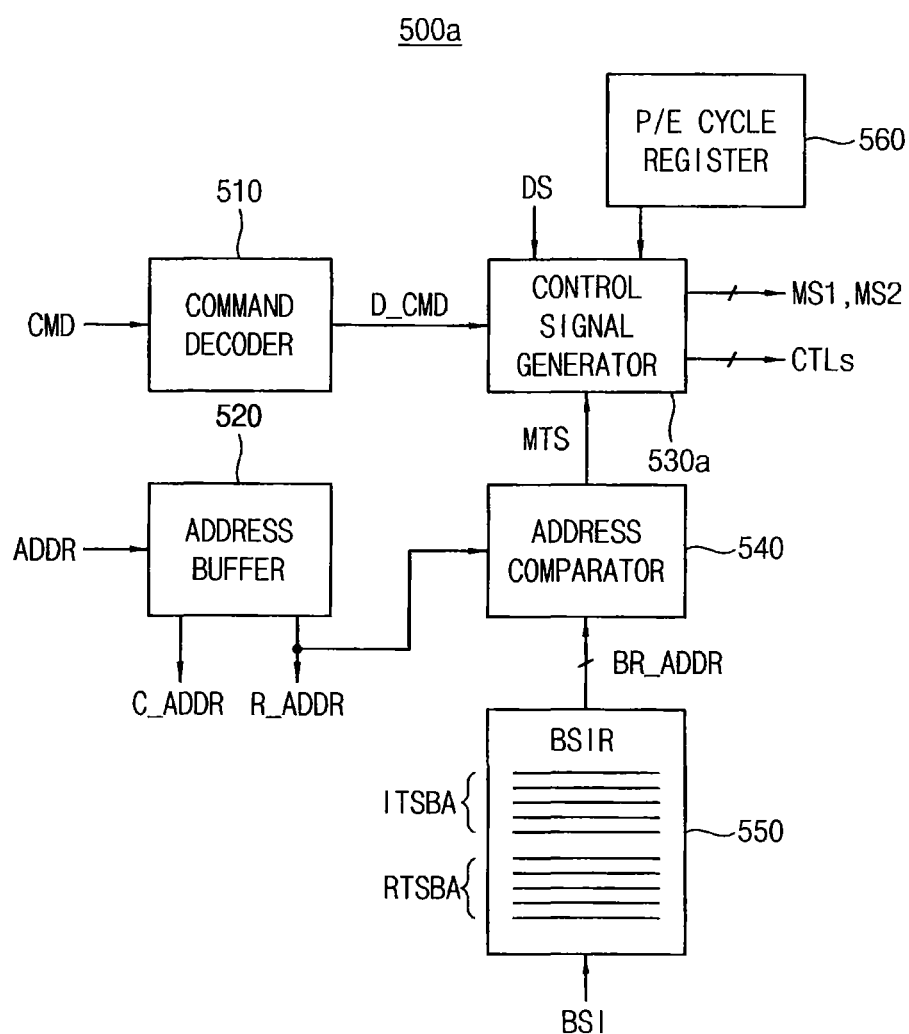
FIG. 12 is a block diagram illustrating an example of the control circuit in the nonvolatile memory device of FIG. 4 according to example embodiments of the present inventive concept.

FIG. 12 is a block diagram illustrating an example of the control circuit in the nonvolatile memory device of FIG. 4 according to example embodiments.

Referring to FIG. 12, a control circuit 500a may include a command decoder 510, an address buffer 520, a control signal generator 530a, an address comparator 540, a bad sub-block information register (BSIR) 550 and a program/erase (P/E) cycle information register 560.

The command decoder 510 decodes the command CMD and provides a decoded command D_CMD to the control signal generator 530a. The address buffer 520 receives the address signal ADDR, provides the row address R_ADDR to the address decoder 600 and the address comparator 540 and provides the column address C_ADDR to the data input/output circuit 420.

The bad sub-block information register 550 may store the bad sub-block information BSI, and the bad sub-block information BSI may include initial bad sub-block addresses ITSBA and run-time bad sub-block addresses RTSBA. The initial bad sub-block addresses ITSBA are addresses of bad sub blocks designated when the nonvolatile memory device 50 is shipped. The run-time bad sub-block addresses RTSBA are addresses of bad sub blocks designated when the nonvolatile memory device 50 is operating.

The address comparator 540 compares the row address R_ADDR with at least one bad sub-block row address BR_ADDR stored in the bad sub-block information register 550 and provides the control signal generator 530a with a match signal MTS indicating a result of the comparison of the row address R_ADDR with the at least one bad sub-block row address BR_ADDR.

The control signal generator 530a receives the decoded command D_CMD and the match signal MTS, generates the control signals CTLs based on whether an operation directed by the decoded command D_CMD is associated with the bad sub-block and provides the control signals CTLs to the voltage generator 700. In addition, the control signal generator 530a receives the detection signal DS and provides the address decoder 600 with the first mode signal MS1 indicating that the level of the substrate voltage VSUB reaches the reference level or that the level of the substrate voltage VSUB is maintained at a certain level, based on the detection signal DS. In addition, the control signal generator 530a provides the address decoder 600 with the second mode signal MS indicating the operation designated by the decoded command D_CMD.

When the match signal MTS indicates that the row address R_ADDR accesses the normal sub-block, the control signal generator 530a generates the control signals CTLs by referring to the program/erase cycle information register 560 such that a first program/erase cycle is applied to the normal sub-block. When the match signal MTS indicates that the row address R_ADDR accesses the bad sub-block, the control signal generator 530a generates the control signals CTLs by referring to the program/erase cycle information register 560 such that a second program/erase cycle is applied to the bad sub-block. The first program/erase cycle is greater than the second program/erase cycle. Therefore, the program/erase cycle on the bad sub-block is slacked and thus endurance of the nonvolatile memory device 50 may be increased.

Figure 13:
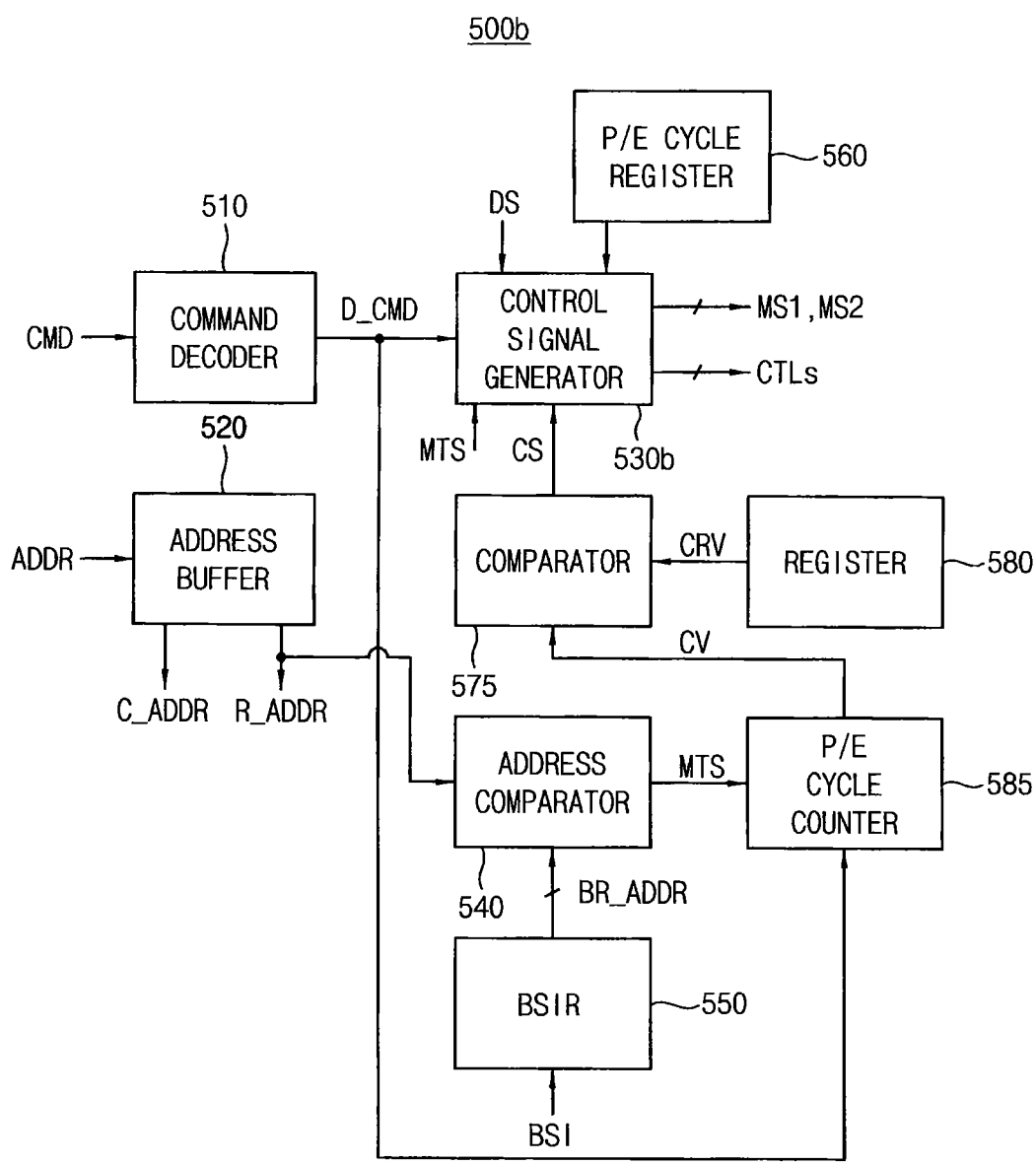
FIG. 13 is a block diagram illustrating another example of the control circuit in the nonvolatile memory device of FIG. 4 according to example embodiments of the present inventive concept.

FIG. 13 is a block diagram illustrating another example of the control circuit in the nonvolatile memory device of FIG. 4 according to example embodiments.

Referring to FIG. 13, a control circuit 500b may include a command decoder 510, an address buffer 520, a control signal generator 530b, an address comparator 540, a bad sub-block information register 550, a program/erase cycle information register 560, a comparator 575, a register 580 and a program/erase cycle register 585.

The control circuit 500b of FIG. 13 differs from the control circuit 500a of FIG. 12 in that the control circuit 500b further includes the comparator 575, the register 580 and the program/erase cycle register 585 and in that the address comparator 540 further provides the match signal MTS to the program/erase cycle register 585.

The program/erase cycle register 585 increases a counting value CV when the row address R_ADDR accesses the bad sub-block and the decoded command D_CMD corresponds to a program command or an erase command, based on the match signal MTS and the decoded command D_CMD. The comparator 575 compares the counting value CV and a reference counting value CRV stored in the register 580 and provides the control signal generator 560b with a comparison signal CV indicating a result of the comparison. The control signal generator 530b receives decoded command D_CMD, the match signal MTS, the comparison signal CS and the done signal DS and generates the control signals CTLS, the first mode signal MS1 and the second mode signal MS2 such that a second program/erase cycle is applied to the bad sub-block when the counting value CV is smaller and equal to the reference counting value and a third program/erase smaller than the reference counting value CRV and the second program/erase cycle is applied to the bad sub-block when the counting value CV exceeds the reference counting value CRY.

Figure 14:
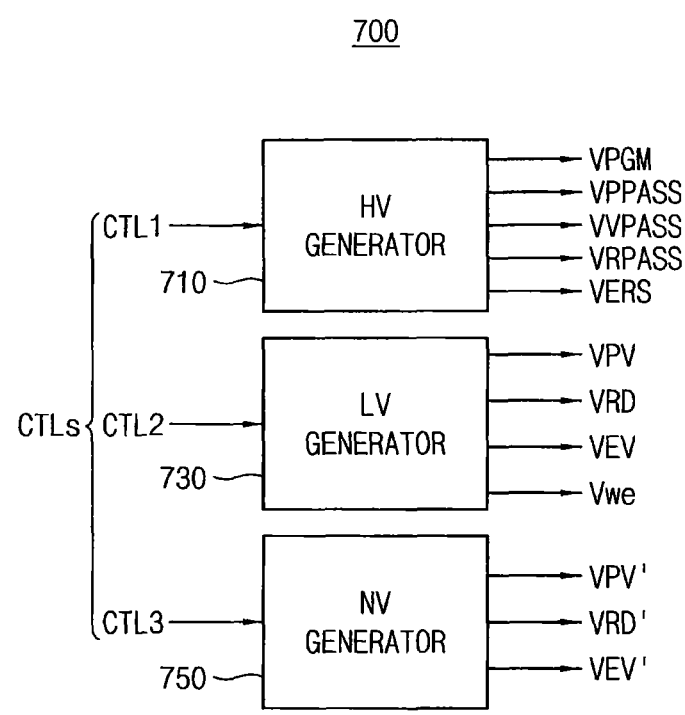
FIG. 14 is a block diagram illustrating the voltage generator in the nonvolatile memory device of FIG. 4 according to example embodiments of the present inventive concept.

FIG. 14 is a block diagram illustrating the voltage generator in the nonvolatile memory device of FIG. 4 according to some embodiments.

Referring to FIG. 14, the voltage generator 700 may include a high voltage generator 710 and a low voltage generator 730. The voltage generator 700 may further include a negative voltage generator 750.

The high voltage generator 710 may generate a program voltage VPGM, a program pass voltage VPPASS, a verification pass voltage VVPASS, a read pass voltage VRPASS and an erase voltage VERS according to operations directed by the command CMD (or, a decoded command D_CMD), in response to a first control signal CTL1 of the control signals CTLs. The program voltage VPGM is applied to the selected word-line, the program pass voltage VPPASS, the verification pass voltage VVPASS, the read pass voltage VRPASS may be applied to the unselected word-lines and the erase voltage VERS may be applied to the well or the substrate of the memory block. The first control signal CTL1 may include a plurality of bits which indicate the operations directed by the command CMD.

The low voltage generator 730 may generate a program verification voltage VPV, a read voltage VRD, an erase verification voltage VER and a word-line erase voltage Vwe according to operations directed by the command CMD, in response to a second control signal CTL2 of the control signals CTLs. The program verification voltage VEV, the read voltage VRD, and the erase verification voltage VEV may be applied to the selected word-line according to operation of the nonvolatile memory device 200. The word-line erase voltage Vwe may be applied to word-lines of the selected sub-block. The second control signal CTL2 may include a plurality of bits which indicate the operations directed by the command CMD.

The negative voltage generator 750 may generate a program verification voltage VPV', a read voltage VRD' and an erase verification voltage VEV' which have negative levels according to operations directed by the command CMD, in response to a third control signal CTL3 of the control signals CTLs. The third control signal CTL3 may include a plurality of bits which indicate the operations directed by the command CMD.

Figure 15:
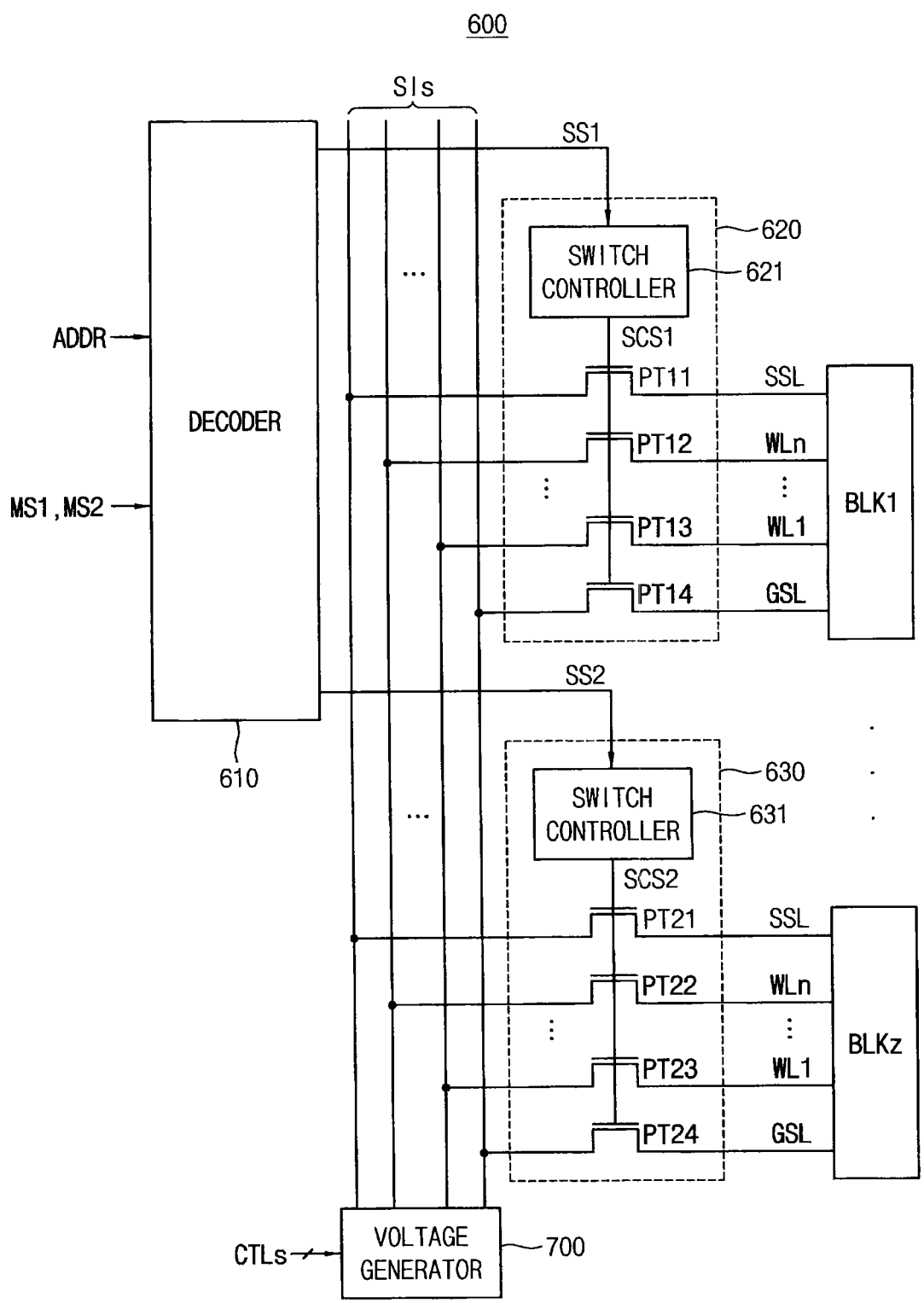
FIG. 15 is a block diagram illustrating the address decoder in the nonvolatile memory device of FIG. 4 according to example embodiments of the present inventive concept.

FIG. 15 is a block diagram illustrating the address decoder in the nonvolatile memory device of FIG. 4 according to some embodiments.

Referring to FIG. 15, the address decoder 600 includes a decoder 610, a first switch circuit 620 and a second switch circuit 630.

The decoder 610 receives the address ADDR (e.g., the row address R_ADDR) and the mode signal MS, generates a first selection signal SS1 and a second selection signal SS2 according to a sub-block directed by the address ADDR and the level of the substrate voltage VSUB or maintaining time interval of the substrate voltage VSUB indicated by the mode signal and provides the first selection signal SS1 and the second selection signal SS2 to the first switch circuit 620 and the second switch circuit 630, respectively. As an example, each of the first selection signal SS1 and the second selection signal SS2 may have a plurality of selection signals for selecting a block among the plurality of blocks in the memory cell array 100.

The first switch circuit 620 and the second switch circuit 630 may be coupled to a plurality of selection lines Sls coupled to the voltage generator 700. The voltage generator 700 may provide the various word—line voltages VWLs to the plurality of selection lines Sls. The first switch circuit 620 is coupled to the memory block BLK1 through at least one string selection line SSL, a plurality of word-lines WL1~WLn and at least one ground selection line GSL. The second switch circuit 630 is coupled to the memory block BLKz through at least one string selection line SSL, a plurality of word-lines WL1~WLn and at least one ground selection line GSL. The ground selection line GSL for BLK1 . . . BLKz may be different (i.e. independent) for each of the first switch circuit 620 and the second switch circuit 630.

The first switch circuit 620 includes a switch controller 621 and a plurality of pass transistors PT11~PT14 coupled to the string selection line SSL, the word-lines WL1~WLn and the ground selection line GSL of the memory block BLK1. The switch controller 621 may control turn-on and turn-off of the pass transistors PT11~PT14 by providing a first switching control signal SCS1 to the pass transistors PT11~PT14 in response to the first selection signal SS1. As an example, the first switching control signal SCS1 may have a plurality of first switching control signals for selecting a sub-block among the plurality of sub-blocks in the memory block BLK1 in response to the first selection signal SS1. As an example, the switch controller 621 may control turn-on timing (e.g., a time interval) of the pass transistors PT11~PT14 by selecting a particular time interval from among a plurality of different time intervals in response to the first switching control signals of the first switching control signal SCS1.

The second switch circuit 630 includes a switch controller 631 and a plurality of pass transistors PT21~PT24 coupled to the string selection line SSL, the word-lines WL1~WLn and the ground selection line GSL of the memory block BLKz. The switch controller 631 may control turn-on and turn-off of the pass transistors PT21~PT24 by providing a second switching control signal SCS2 to the pass transistors PT21~PT24 in response to the second selection signal SS2. As an example, the second switching control signal SCS2 may have a plurality of second switching control signals for selecting a sub-block among the plurality of sub-blocks in the memory block BLKz in response to the second selection signal SS2. The switch controller 631 may control turn-on timing (e.g., a time interval) of the pass transistors PT21~PT24 by selecting a particular time interval from among a plurality of different time intervals in response to the second switching control signals of the second switching control signal SCS2.

Figure 16:
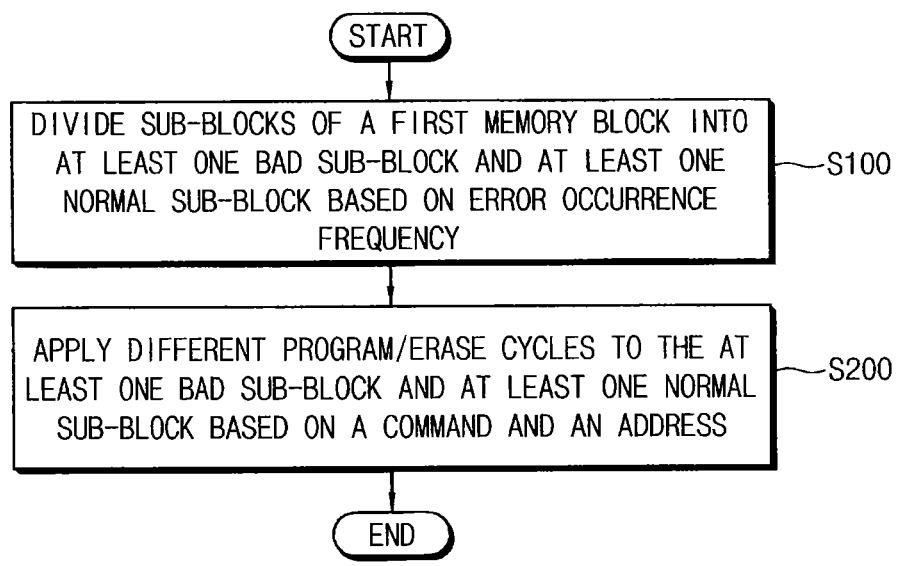
FIG. 16 is a flow chart illustrating a method of operating a nonvolatile memory device according to example embodiments of the present inventive concept.

FIG. 16 is a flow chart illustrating a method of operating a nonvolatile memory device according to some embodiments.

Hereinafter, it is assumed that the first sub-block SB1 of the sub-blocks SB1, SB2 and SB3 in the memory block BLKi of FIG. 7, which is adjacent to the substrate, corresponds to at least one bad sub-block and the second and third sub-blocks SB2 and SB3 correspond to at least one normal sub-block.

A block in a NAND flash memory may suffer from a malfunction caused by program failure or erase failure. In this case, the block is regarded as a run-time bad block and replaced with another block previously reserved. Besides a run-time bad block, there may an initial bad block that is already known as a bad block when a NAND flash memory is shipped from a factory. Generally, a small number of run-time bad blocks are generated over a long period of time when a NAND flash memory is used. In addition, a small number of initial bad blocks normally exist when the NAND flash memory is shipped from a factory. However, if a large number of run-time bad blocks are generated in a short period of time or a large number of initial bad blocks exist in the early stage, all reserved blocks may be exhausted. Therefore, a nonvolatile memory device cannot be used any longer. For this reason as well, the lifetime of the semiconductor storage device is limited.

Since the first sub-block SB1 is formed adjacent to the substrate and have a narrow channel width, memory cells in the first sub block SB1 are greatly influenced by stress due to the program voltage or the erase voltage. Therefore, a probability of error occurrence is higher in the first sub-block SB1, the first sub-block SB1 may be assigned as a bad sub-block.

Referring to FIGS. 2 through 16, for overcoming the limit of the lifetime, according to some embodiments, the control circuit 500 divides sub-blocks of a first memory block of the plurality of memory blocks into at least one bad sub-block (bad sub-block) and at least one normal sub-block (normal sub-block) based on error occurrence frequency of each of the sub-blocks in the first memory block (S100). Information on the bad sub-block may be stored in the bad sub-block information registers 49 of FIG. 2 and/or 550 of FIG. 12. The control circuit 500 may apply different program/erase cycles to the bad sub-block and the normal sub-block based on the command CMD and the address ADDR (S200). The control circuit 500 may apply slacked program/erase cycle to the bad sub-block to increase the lifetime of the nonvolatile memory device 50.

Figure 17:
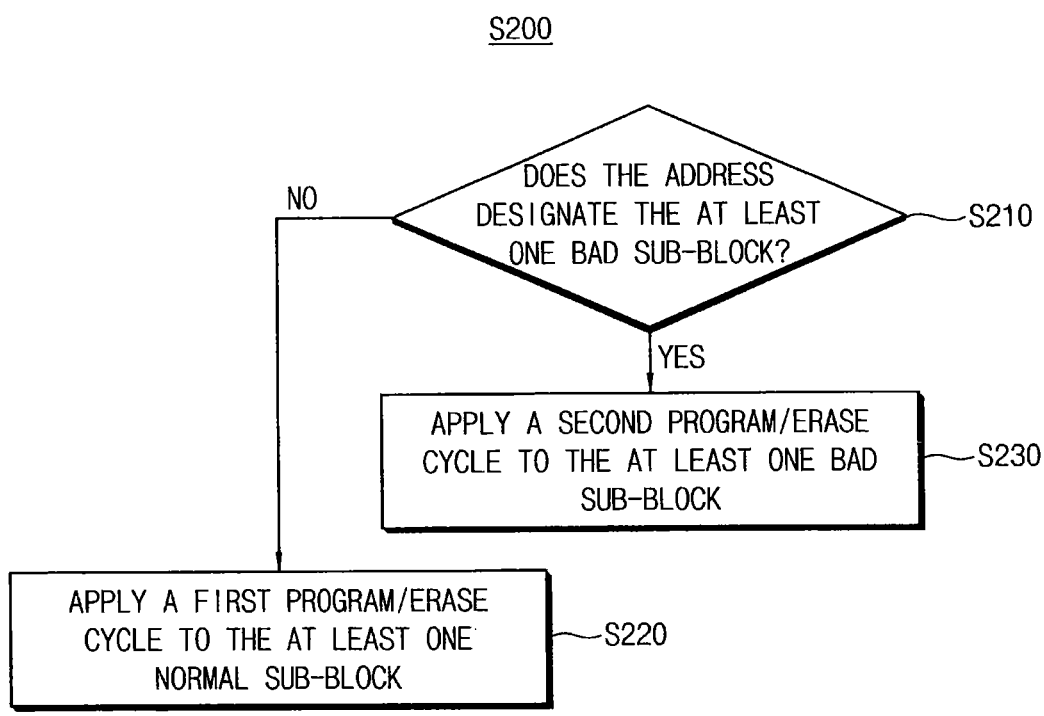
FIG. 17 is a flow chart illustrating operation of applying the different program/erase cycles in FIG. 16 in detail according to example embodiments of the present inventive concept.

FIG. 17 is a flow chart illustrating operation of applying the different program/erase cycles in FIG. 16 in detail.

Figure 18:
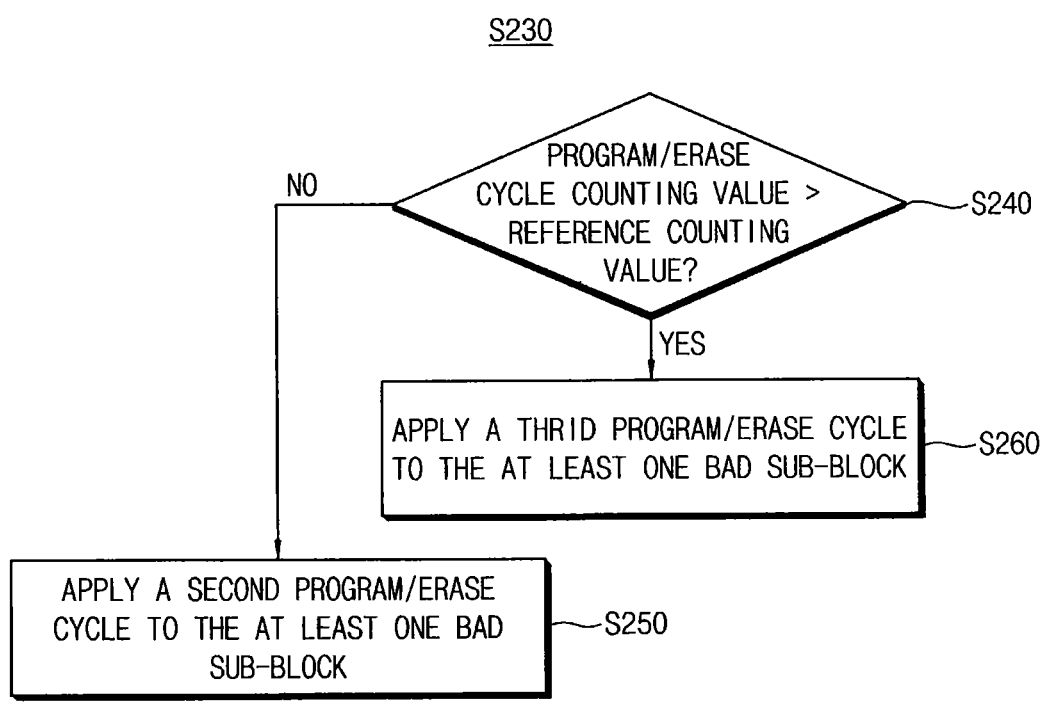
FIG. 18 is a flow chart illustrating operation of at least a second program/erase cycle is applied in detail in FIG. 17 according to example embodiments of the present inventive concept.

FIG. 18 is a flow chart illustrating operation of at least a second program/erase cycle is applied in detail in FIG. 17.

Figure 19A:
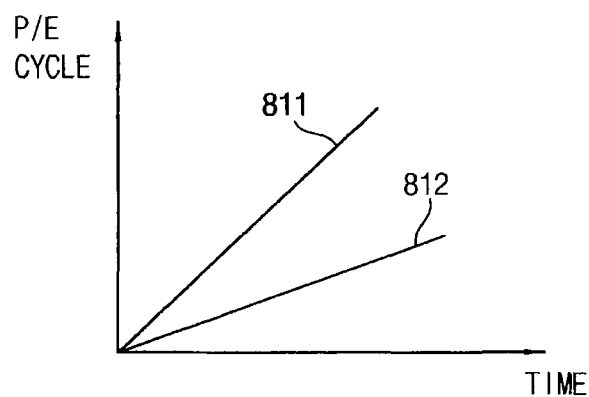
FIGS. 19A and 19B illustrate program/erase cycles applied to the normal sub-block and the bad sub-block, respectively according to example embodiments of the present inventive concept.
Figure 19B:
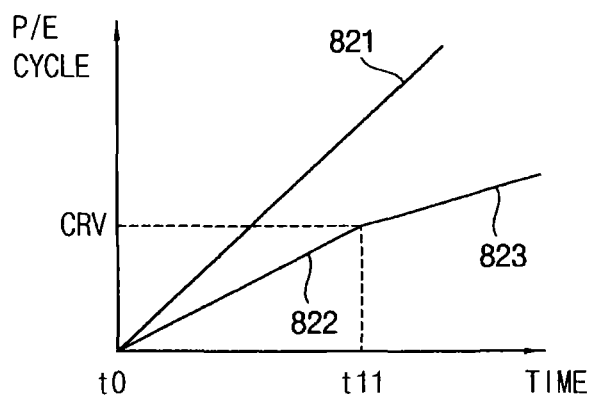

FIGS. 19A and 19B illustrate program/erase cycles applied to the normal sub-block and the bad sub-block, respectively.

Referring to FIGS. 17 through 19B, for applying different program/erase cycles to the normal sub-block and the bad sub-block (S200), the control circuit 500 of FIG. 4 determines whether the row address R_ADDR designates the bad sub-block (S210). When the row address R_ADDR designates the normal sub-block (NO in S210), the control circuit 500 controls the voltage generator 700 of FIG. 14 and the address decoder 600 of FIG. 15 by referring to the program/erase cycle information register 560 such that a first program/erase cycle 811 or 812 is applied to the normal sub-block (S220). When the row address R_ADDR designates the bad sub-block (YES in S210), the control circuit 500 controls the voltage generator 700 and the address decoder 600 by referring to the program/erase cycle information register 560 such that at least a second program/erase cycle 812 or 822 is applied to the bad sub-block (S230).

Referring to FIG. 18 for applying the at least second program/erase cycle to the bad sub-block (S230), the control circuit 500 determines whether a counting value CV of the program/erase cycle on the bad sub-block exceeds a reference counting value CRV (S240). When the counting value CV of the program/erase cycle on the bad sub-block does not exceed the reference counting value CRV (NO in S240), the control circuit 500 controls the voltage generator 700 and the address decoder 600 such that at the second program/erase cycle 822 is applied to the bad sub-block (S250) during an interval between timing points t0 and t11. When the counting value CV of the program/erase cycle on the bad sub-block exceeds the reference counting value CRV (YES in S240), the control circuit 500 controls the voltage generator 700 and the address decoder 600 such that at a third program/erase cycle 82 is applied to the bad sub-block (S260) from the timing point t11 at which the program/erase cycle on the bad sub-block exceeds the reference counting value CRV.

In FIG. 19A, the second program/erase cycle 812 is runs in less time than the first program/erase cycle 811 and in FIG. 19B, the second program/erase cycle 822 is runs in less time (i.e. a smaller time interval) than the first program/erase cycle 821 and the third program/erase cycle 823 runs in less time (i.e. a smaller time interval) than the second program/erase cycle 822.

Figure 20:
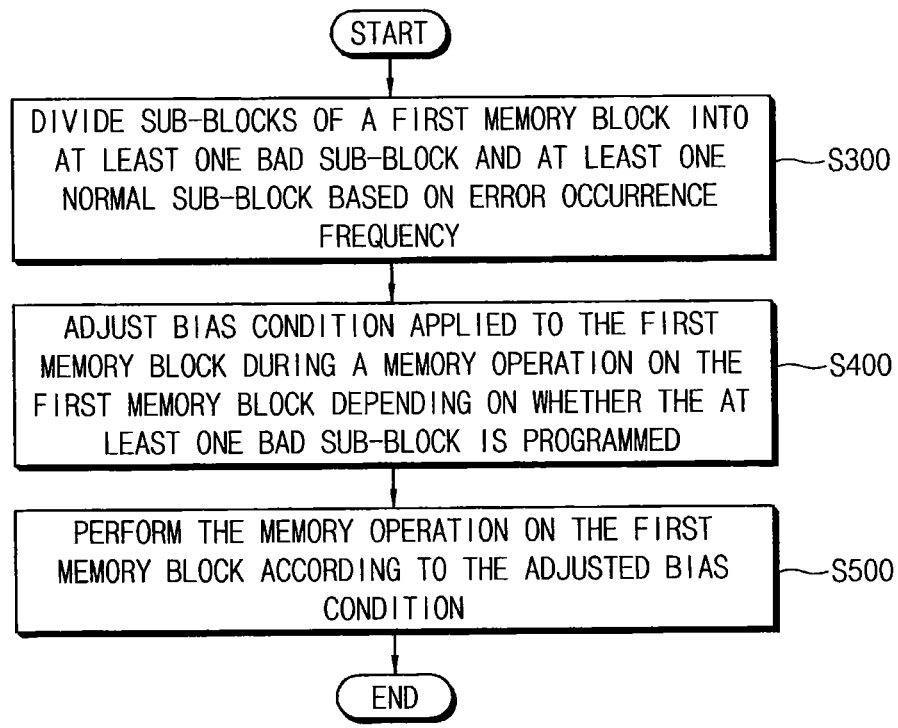
FIG. 20 is a flow chart illustrating a method of operating a nonvolatile memory device according to example embodiments of the present inventive concept.

FIG. 20 is a flow chart illustrating a method of operating a nonvolatile memory device according to some embodiments.

Hereinafter, it is assumed that the first sub-block SB1 of the sub-blocks SB1, SB2 and SB3 in the memory block BLKi of FIG. 7, which is adjacent to the substrate, corresponds to at least one bad sub-block and the second and third sub-blocks SB2 and SB3 correspond to at least one normal sub-block.

Referring to FIGS. 2 through 15 and 20, the control circuit 500 divides sub-blocks of a first memory block of the plurality of memory blocks into at least one bad sub-block (bad sub-block) and at least one normal sub-block (normal sub-block) based on error occurrence frequency of each of the sub-blocks in the first memory block (S400). The control circuit 500 adjusts a bias condition applied to the first memory block during a memory operation on the first memory block depending on whether the bad sub-block is programmed (S400). The control circuit 500 controls the voltage generator 700 and the address decoder 600 such that the memory operation is performed on the first memory block according to the adjusted bias condition (S500). The memory operation may be an erase operation or a program operation on the first memory block.

FIGS. 21A through 26B illustrate bias conditions applied to sub-blocks in the first memory block, respectively.

In FIGS. 21A through 26B, there will be descriptions on the sub-blocks SB1, SB2 and SB2 coupled to the bit-line BL1 in the memory block BLKi of FIG. 7.

Figure 21A:
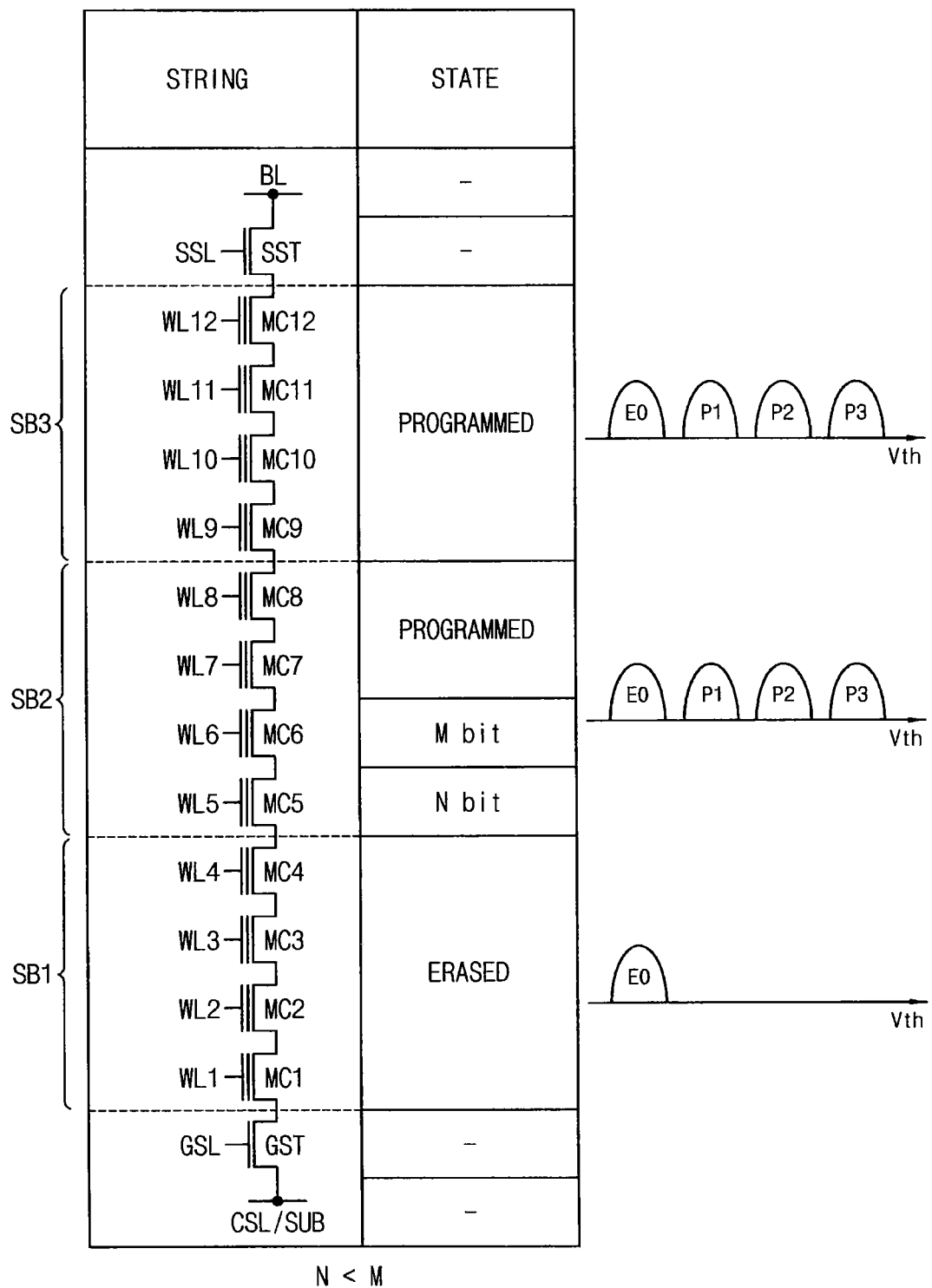
FIGS. 21A through 26B illustrate bias conditions applied to sub-blocks in the first memory block, respectively according to example embodiments of the present inventive concept.
Figure 21B:
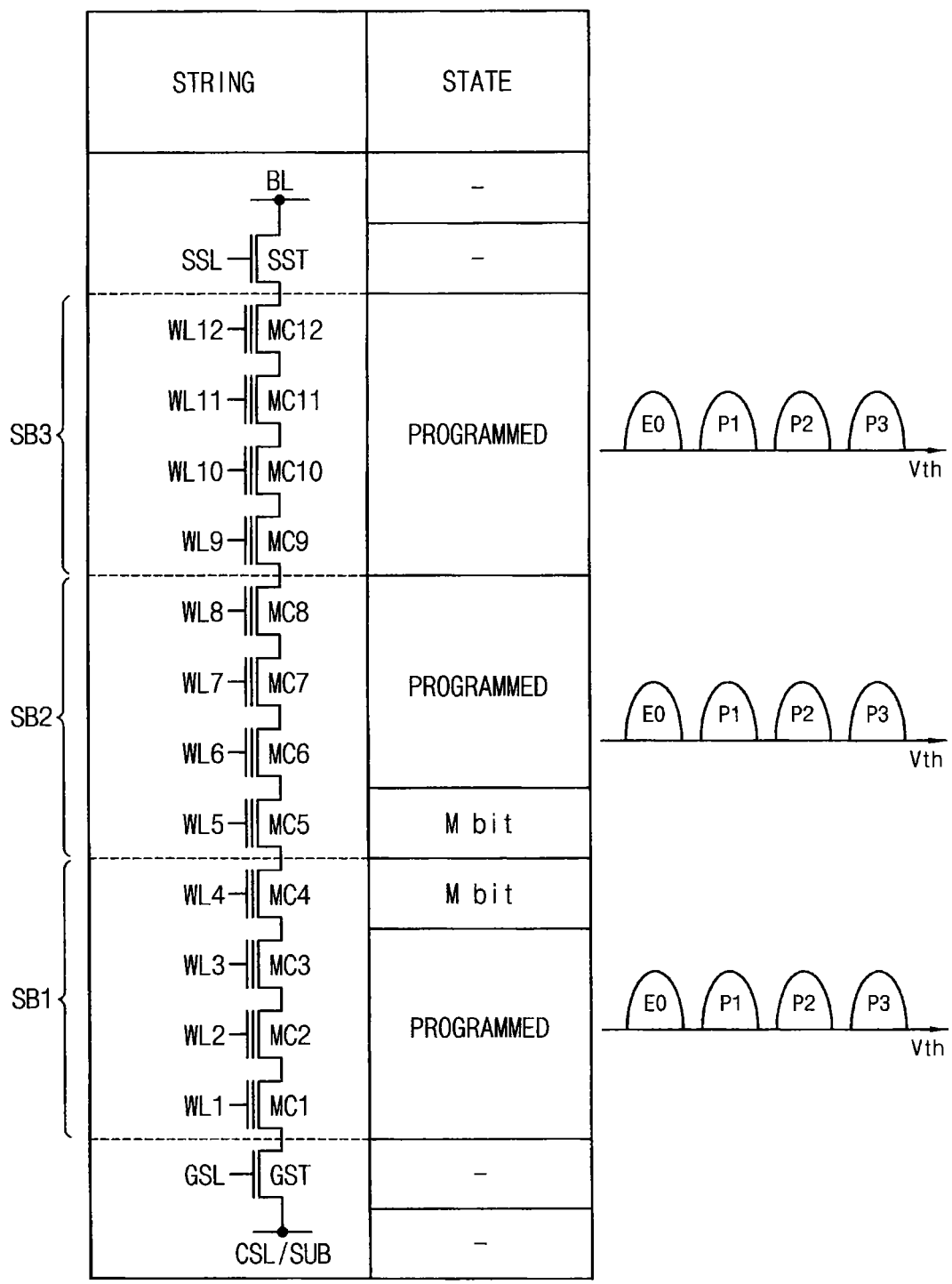

FIGS. 21A and 21B illustrate program states of the sub-block in the memory block of FIG. 7.

FIG. 21A illustrates that the second sub-block SB2 and the third sub-block SB3 are programmed to an erase state E and program states P1, P2 and P3 and FIG. 21B illustrates that the first through third sub-blocks SB1, SB2 and SB3 are programmed to the erase state E and the program states P1, P2 and P3. When the memory operation is performed on the memory block BLKi, whether the first sub-block SB1 (bad sub-block) is programmed or not influences threshold voltages of the second sub-block SB2 and the third sub-block SB3. Therefore, the control circuit 500 may adjust the bias condition applied to the first memory block based on whether the bad sub-block is programmed by considering the influence. The sub-block SB is more influenced by the bad sub-block when the bad sub-block is programmed than when the bad sub-block is not programmed.

When memory cells in each of the sub-blocks SB1, SB2, SB3 can store M-bits and when the memory operation on the first memory block is completed with the bad sub-block SB1 being not programmed, N-bits may be programmed in memory cells coupled to a boundary word-line WL5 adjacent to the bad sub-block SB1 as illustrated in FIG. 21A. Here, M is an integer greater than one and N is a natural number smaller than M. Since N-bits are programmed in the memory cells coupled to the boundary word-line WL5, margin between the program states of the memory cells coupled to the boundary word-line WL5 may be increased. In addition, when the memory operation on the first memory block is completed with the bad sub-block SB1 being programmed, M-bits may be programmed in the memory cells coupled to the boundary word-line WL5 as in FIG. 21B.

Figure 22A:
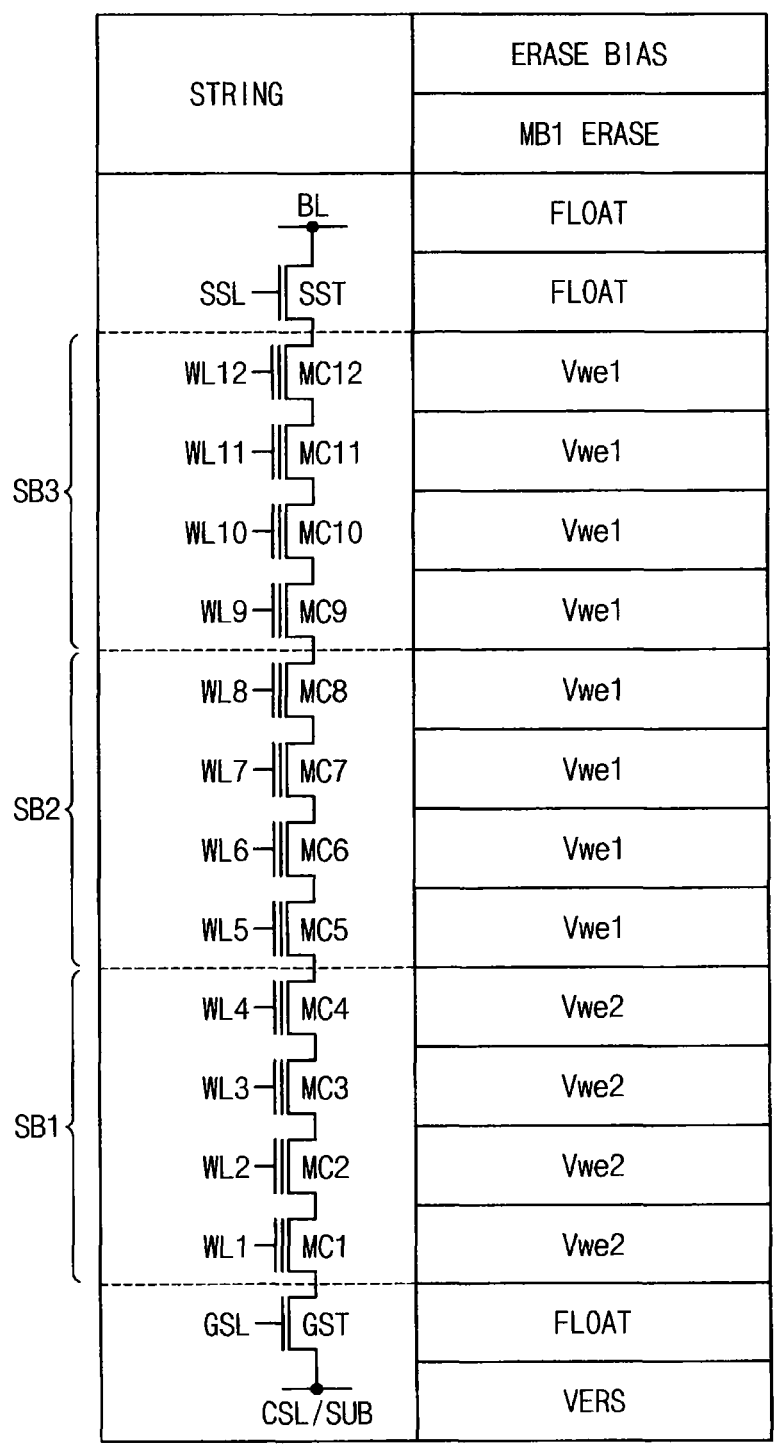

FIG. 22A illustrates an erase bias condition of the first memory block MB1 during an erase operation on the first memory block when the bad sub-block is not programmed.

Referring to FIG. 22A, the control circuit 500 controls the address decoder 600 to float the bit-line BL, the string selection line SSL and the ground selection line GSL of the cell string, controls the voltage generator 700 and the address decoder 600 to apply a first word-line erase voltage Vwe1 to the word-lines WL5~WL12 of the second and third sub-blocks SB2 and SB3, to apply a second word-line erase voltage Vwe2 to the word-lines WL1~WL4 of the bad sub-block SB1 and to apply the erase voltage VERS to the substrate. The first word-line erase voltage Vwe1 may have a ground voltage level or a positive voltage level which is substantially the same as the ground voltage level and the second word-line erase voltage Vwe2 is higher than the first word-line erase voltage Vwe1. Therefore, over-erase of the bad sub-block BS1 may be prevented.

Figure 22B:
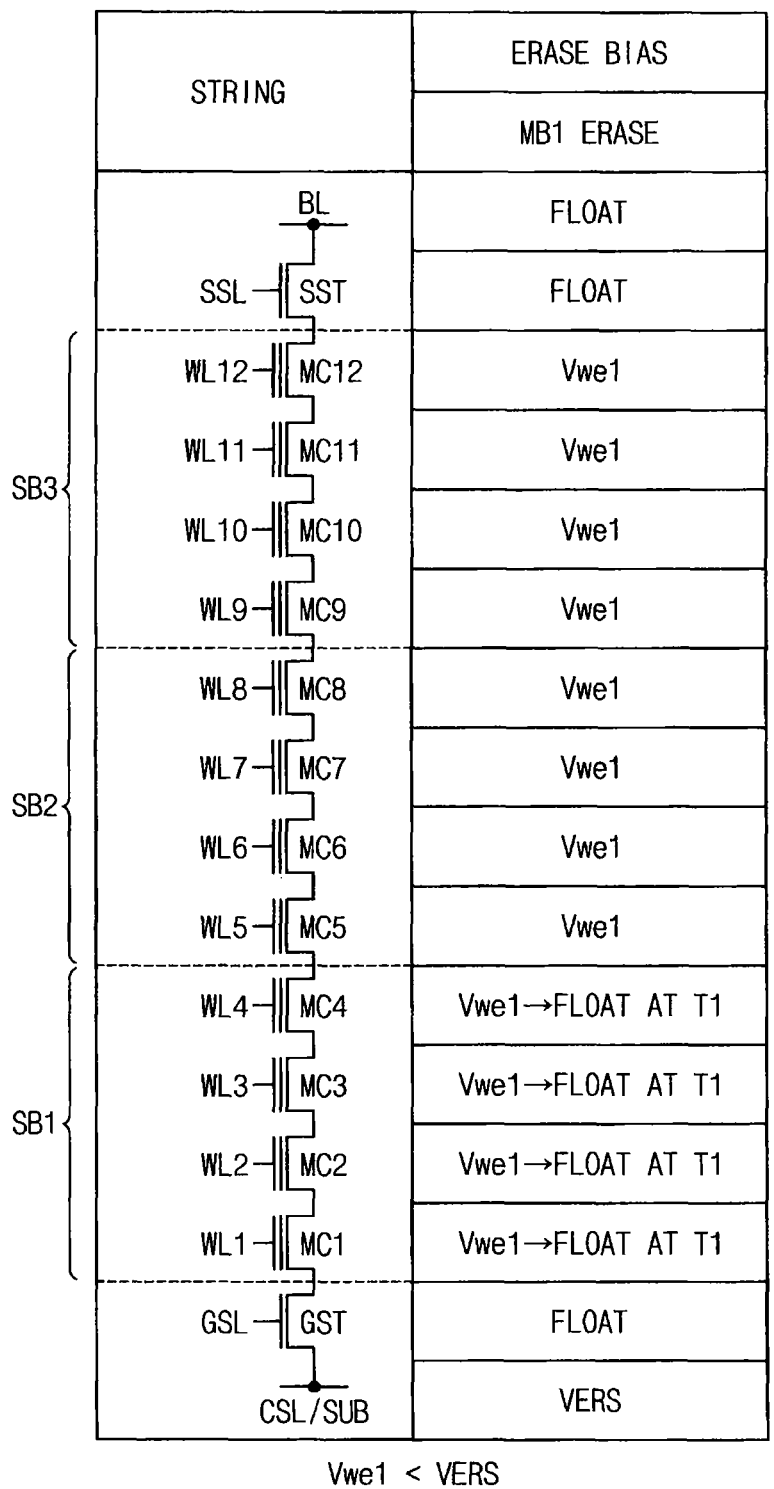
Figure 23A:
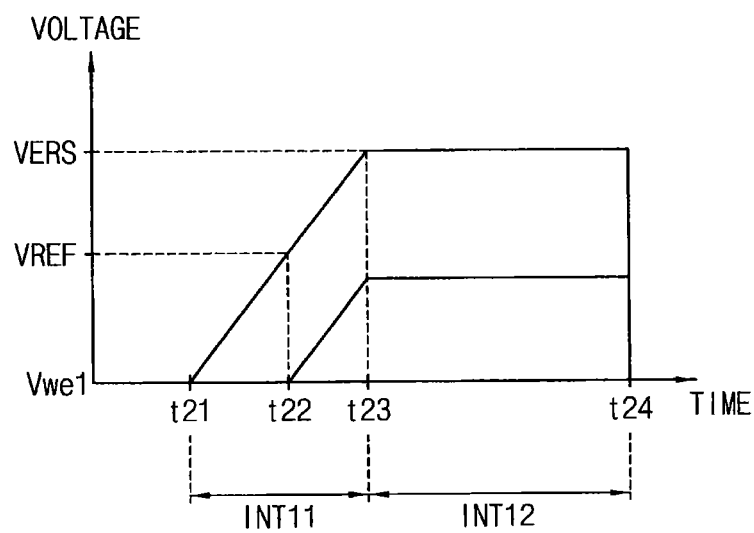
Figure 23B:
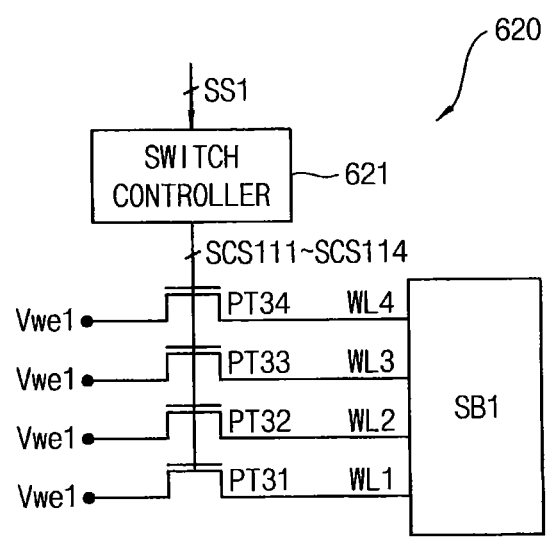

FIG. 22B illustrates an erase bias condition of the first memory block MB1 during an erase operation on the first memory block when the bad sub-block is programmed. FIG. 23A illustrates a change in voltage of the bad sub-block and a change in voltage of the substrate when the erase bias condition of FIG. 22B is employed. FIG. 23B illustrates the first switch circuit in FIG. 13 when the erase bias condition of FIG. 22B.

Referring to FIGS. 22B and 23A, the control circuit 500 controls the address decoder 600 to float the bit-line BL, the string selection line SSL and the ground selection line GSL of the cell string, controls the voltage generator 700 and the address decoder 600 to apply the first word-line erase voltage Vwe1 to the word-lines WL5~WL12. The control circuit 500 controls the voltage generator 700 and the address decoder 600 to apply the first word-line erase voltage Vwe1 to the word-lines WL1~WL4 of the bad sub-block SB1 during a first time interval INT11 during which the voltage level VSUB of the substrate 111 increases with a constant slope in response to the erase voltage VERS applied to the substrate 111. The first time interval INT11 starts from a timing point t21 at which the erase voltage VERS is applied to the substrate 111 and ends at a timing point t13 at which the voltage level VSUB of the substrate 111 reaches a voltage level of the erase voltage VERS. The address decoder 600 floats the word-lines WL1~WL4 of the bad sub-block SB1 at a time point t22 in the first time interval INT11 while the first word-line erase voltage Vwe1 is applied to the word-lines WL1~WL4 of the bad sub-block SB1.

When the word-lines WL1~WL4 of the bad sub-block SB1 are floated at the timing point t22, each voltage level of the word-lines WL1~WL4 of the bad sub-block SB1 follows the voltage level VSUB of the substrate 111. The timing point t22 may be a time point at which the voltage level VSUB reaches a reference level VREF in response to the erase voltage VERS applied to the substrate 111. The voltage level of each of the word-lines WL1~WL4 of the bad sub-block SB1 maintained as a level during a second time interval INT12. The second time interval INT12 starts from the timing point t23 and ends at a timing point t24.

Referring to FIG. 23B, each of the word-lines WL1~WL4 of the bad sub-block SB1 is coupled to each of pass transistors PT31~PT34 and each of switching control signals SCS111~SCS114 is applied to each gate of the pass transistors PT31~PT34. The switch controller 621 enables the switching control signals SCS111~SCS114 until the timing point t22 in the first time interval INT11 and disables the switching control signals SCS111 and SCS114 at the time point t22 to float word-lines WL1~WL4 of the bad sub-block SB1, in response to the first selection signal SS1.

Figure 24:
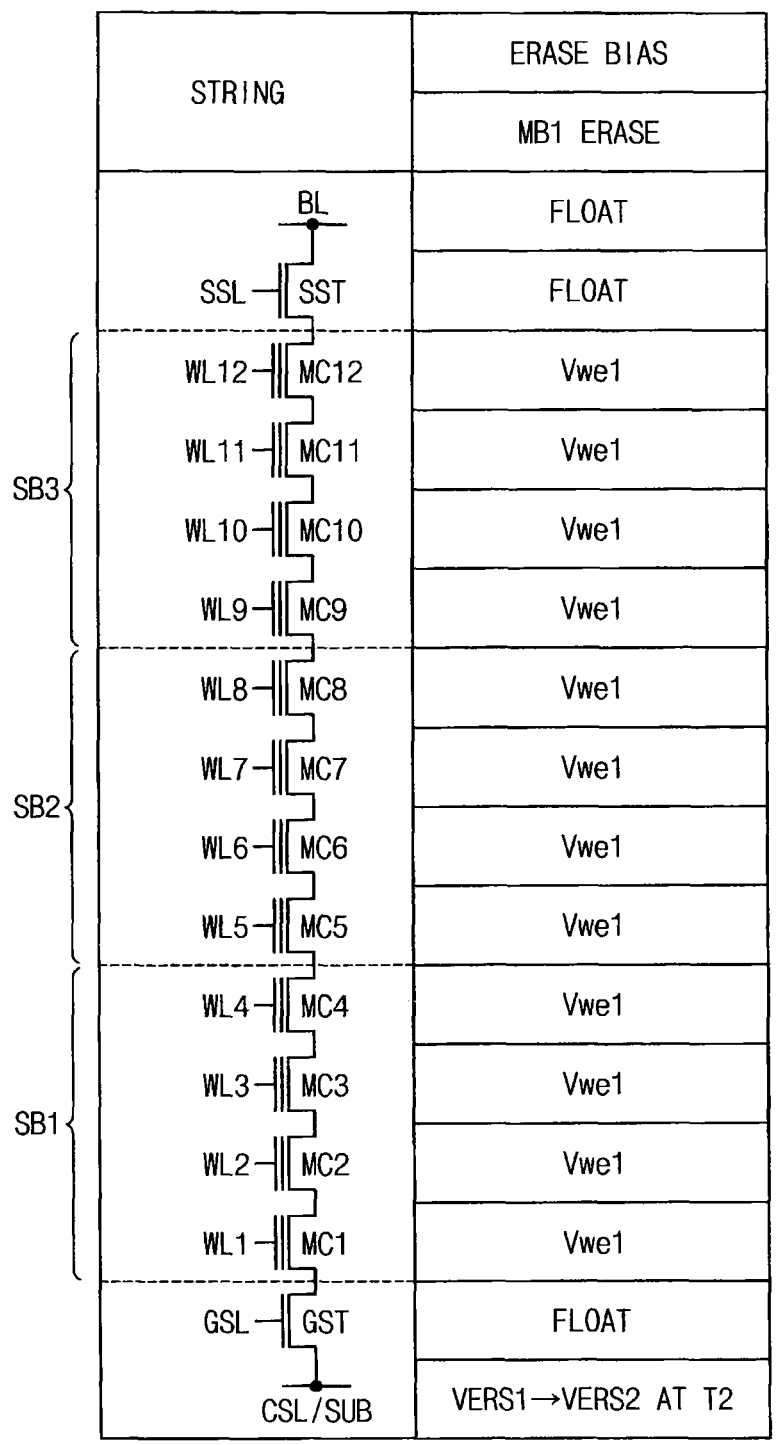
Figure 25:
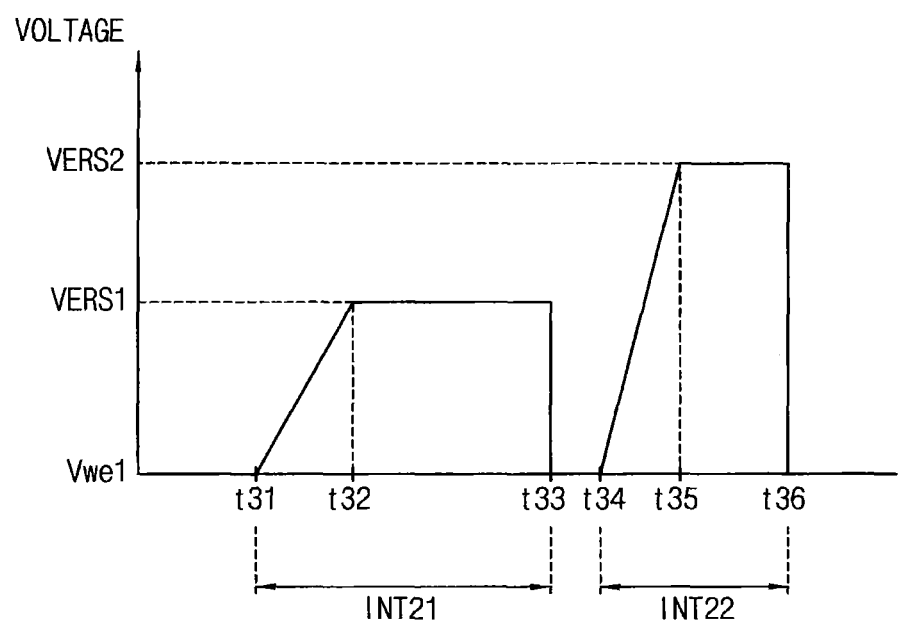

FIG. 24 illustrates an erase bias condition of the first memory block MB1 during an erase operation on the first memory block when the bad sub-block is not programmed. FIG. 25 illustrates a change in a voltage of the substrate when the erase bias condition of FIG. 24 is employed.

Referring to FIGS. 24 and 25, the control circuit 500 controls the address decoder 600 to float the bit-line BL, the string selection line SSL and the ground selection line GSL of the cell string, and controls the voltage generator 700 and the address decoder 600 to apply the first word-line erase voltage Vwe1 to the word-lines WL1~WL12 of first through third sub-blocks SB1, SB2 and SB3. The control circuit 500 controls the voltage generator 700 and the address decoder 600 to apply the erase voltage VERS to the substrate 111 from a timing point t31 and to maintain a level of the erase voltage VERS at a first level VERS1 during an interval from a timing point t32 to a timing point t33 when the erase voltage VERS reaches the first level VERS1 at the timing point t33. During a first time interval INT21, the bad sub-block SB1 is erased prior to the second and third sub-blocks SB2 and SB3. The first time interval INT21 starts at the timing point t31 and ends at the timing point t33. The control circuit 500 cuts off application of the erase voltage VERS erase voltage to the substrate 111 between timing points t33 and t34. The control circuit 500 controls the voltage generator 700 and the address decoder 600 to apply the erase voltage VERS to the substrate 111 from the timing point t34 again and to maintain a level of the erase voltage VERS at a second level VERS2 during an interval from a timing point t35 to a timing point t36 when the erase voltage VERS reaches the second level VERS2 at the timing point t35. During a second time interval INT22, the normal sub-blocks SB2 and SB3 are erased. The second time interval INT22 starts at the timing point t34 and ends at the timing point t36. Since the bad sub-block SB1 erased prior to the second and third sub-blocks SB2 and SB3, the stress of the erase voltage VERS on the bad sub-block SB1 may be reduced.

Figure 26A:
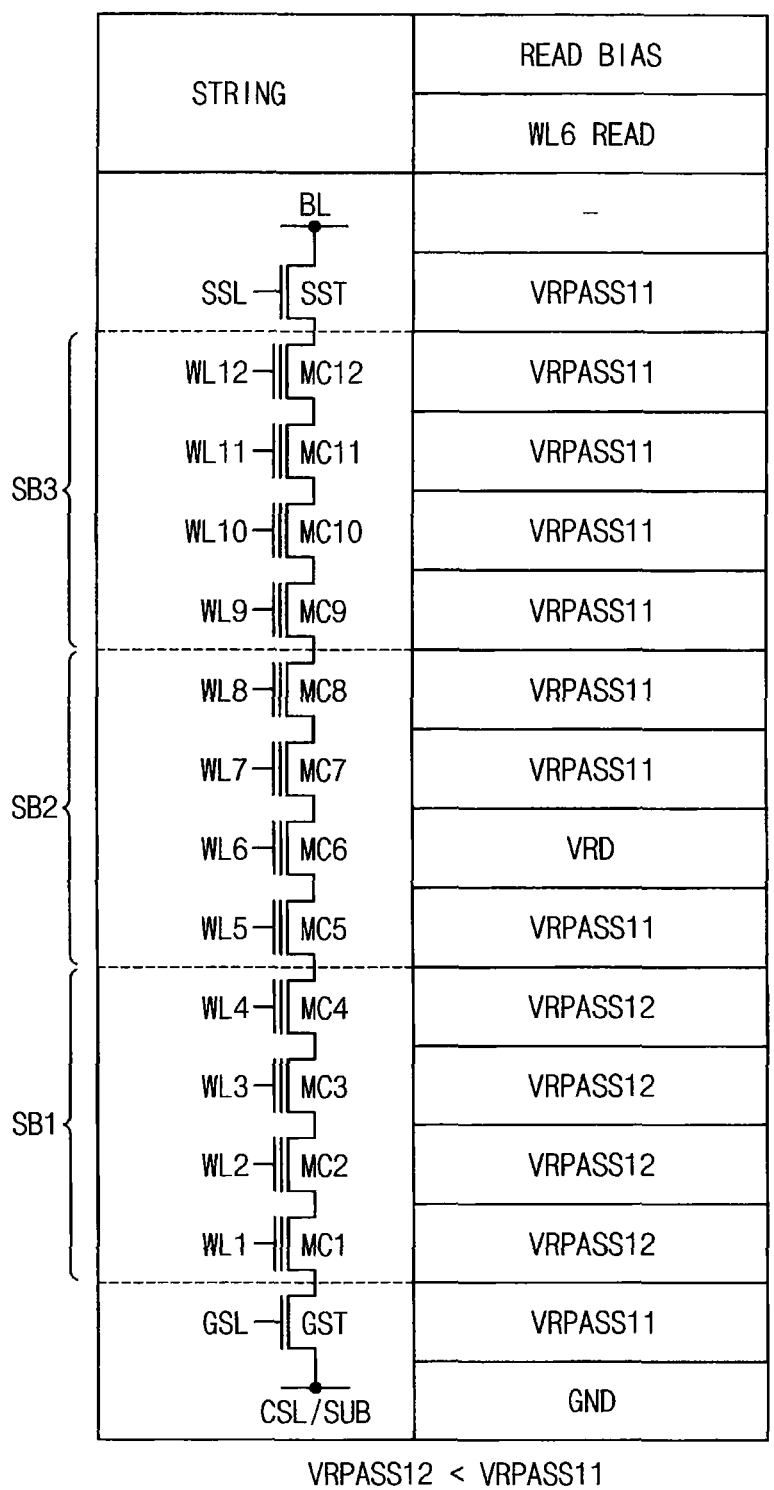

FIG. 26A illustrates a read bias condition of the first memory block during a read operation on the first memory block when the bad sub-block is not programmed.

Figure 26B:
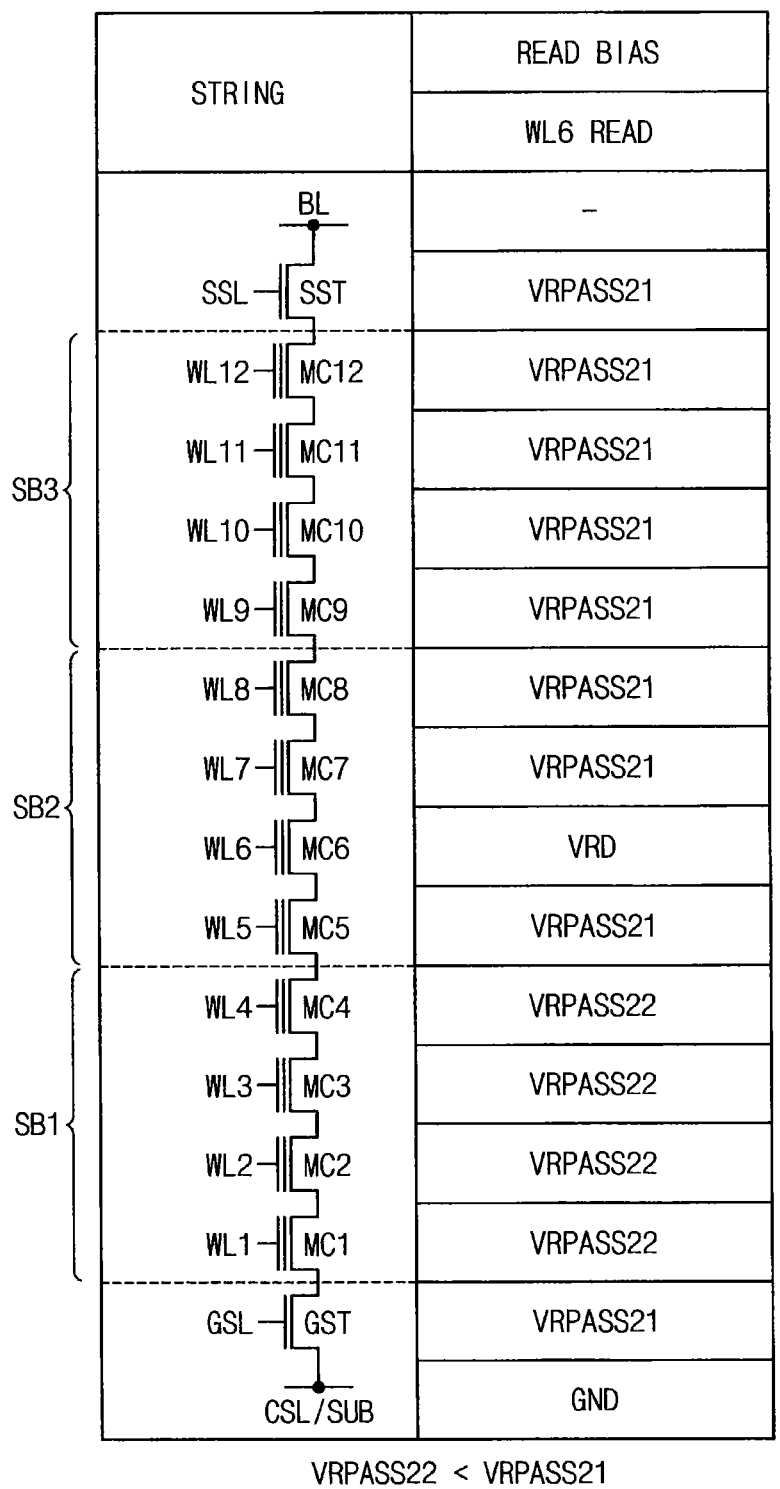

FIG. 26B illustrates a read bias condition of the first memory block during a read operation on the first memory block when the bad sub-block is programmed.

In FIGS. 26A and 26B, it is assumed that a read operation is performed on memory cells coupled to the word-line WL6 of the second sub-block (normal sub-block).

Referring to 26A, the control circuit 500 controls the voltage generator 700 and the address decoder 600 to apply a first read pass voltage VRPASS11 to the bit-line BL, the string selection line SSL, the ground selection line GSL of the cell string and the word-lines WL5 and WL7~WL12, to apply the read voltage VRD to the word-line WL6 and to apply a second read pass voltage VRPASS12 to the word-lines WL1~WL4 of the bad sub-block SB1. A level of the first read pass voltage VRPASS11 may be higher than a level of the second read pass voltage VRPASS12. Since memory cells in the bad sub-block SB1 are erased, all of the memory cells in the bad sub-block SB1 may be turned-on in response to the second read pass voltage VRPASS12.

Referring to 26B, the control circuit 500 controls the voltage generator 700 and the address decoder 600 to apply a first read pass voltage VRPASS21 to the bit-line BL, the string selection line SSL, the ground selection line GSL of the cell string and the word-lines WL5 and WL7~WL12, to apply the read voltage VRD to the word-line WL6 and to apply a second read pass voltage VRPASS22 to the word-lines WL1~WL4 of the bad sub-block SB1. A level of the first read pass voltage VRPASS21 may be equal to or higher than a level of the second read pass voltage VRPASS22. In addition, the level of the second read pass voltage VRPASS22 may be higher than the second read pass voltage VRPASS12. Since memory cells in the bad sub-block SB1 are programmed, the second read pass voltage VRPASS22 may have a level for turning-on all of the memory cells in the bad sub-block SB1.

According to some embodiments, a nonvolatile memory device may divide sub-blocks in a first memory block into at least one bad sub-block and at least one normal sub-block based on error occurrence frequency of each of the sub-blocks or based on endurance characteristic due to positions of the sub-blocks, may apply different program/erase cycles to the at least one bad sub-block and the at least one normal sub-block and may apply adjust bias condition to the first memory block during a memory operation of the first memory block. Therefore, the nonvolatile memory device may enhance performance and prevent reduction of a lifetime of the nonvolatile memory device.

Figure 27:
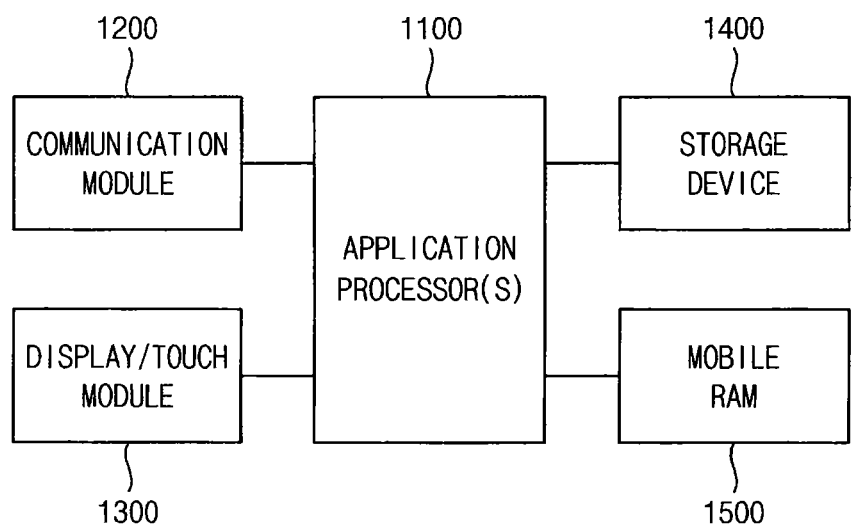
FIG. 27 is a block diagram illustrating a mobile device according to example embodiments of the present inventive concept.

FIG. 27 is a block diagram illustrating a mobile device according to example embodiments.

Referring to FIG. 27, a mobile device 1000 may include an application processor 1100, a communication module 1200, a display/touch module 1300, a storage device 1400, and a mobile RAM 1500.

The application processor 1100 controls operations of the mobile device 1000. The application processor 1100 may perform any of the operations of the flowcharts of FIGS. 16, 17, 18, and/or 20. The communication module 1200 is implemented to perform wireless or wire communications with an external device. The display/touch module 1300 is implemented to display data processed by the application processor 1100 or to receive data through a touch panel. The storage device 1400 may be implemented to store user data.

The storage device 1400 may be eMMC, SSD, UFS device, etc. The storage device 1400 may employ the storage device 30 of FIG. 2. The storage device 1400 may include a memory controller and at least one nonvolatile memory device. The at least one nonvolatile memory device may include the nonvolatile memory device 50 of FIG. 4. The mobile RAM 1500 temporarily stores data used for processing operations of the mobile device 1000.

A nonvolatile memory device or a storage device according to some embodiments may be packaged using various package types or package configurations.

The present disclosure may be applied to various electronic devices including a nonvolatile memory device. For example, the present disclosure may be applied to systems such as be a mobile phone, a smart phone, a personal digital assistant (PDA), a portable multimedia player (PMP), a digital camera, a camcorder, personal computer (PC), a server computer, a workstation, a laptop computer, a digital TV, a set-top box, a portable game console, a navigation system, etc.

The foregoing is illustrative of some embodiments and is not to be construed as limiting thereof. Although a few example embodiments have been described, those skilled in the art will readily appreciate that many modifications are possible in the example embodiments without materially departing from the novel teachings and advantages of the present disclosure. Accordingly, all such modifications are intended to be included within the scope of the present disclosure as defined in the claims.

What is claimed is:

1. A nonvolatile memory device comprising:
a memory cell array comprising a plurality of memory blocks, each of the plurality of memory blocks comprising a plurality of memory cells coupled to word-lines respectively, the word-lines being stacked vertically on a substrate, some memory cells of the plurality of memory cells being selectable by a sub-block unit smaller than one memory block of the plurality of memory blocks; and
a control circuit configured to divide sub-blocks of a first memory block of the plurality of memory blocks into at least one bad sub-block and at least one normal sub-block based on error occurrence frequency of each of the sub-blocks of the first memory block, and configured to apply different duration program/erase cycles to the at least one bad sub-block than to the at least one normal sub-block based on a command and an address provided from external to the nonvolatile memory device,
wherein the at least one bad sub-block is adjacent the at least one normal sub-block,
wherein the control circuit is further configured to apply a first program/erase cycle of a first duration to the at least one normal sub-block when the address designates the at least one normal sub-block, and apply a second program/erase cycle of a second duration to the at least one bad sub-block until a reference counting value is exceeded and apply a third program/erase cycle of a third duration to the at least one bad sub-block after the reference counting value is exceeded when the address designates the at least one bad sub-block, and
wherein the second program/erase cycle of the second duration runs in a first time interval that is less than a second time interval of the first duration of the first program/erase cycle, and
wherein the third program/erase cycle runs in a third time interval that is less than the second time interval of the second program/erase cycle.

2. The nonvolatile memory device of claim 1, further comprising:
a voltage generator configured to generate word-line voltages based on control signals; and
an address decoder configured to transfer the word-line voltages to the at least one bad sub-block and the at least one normal sub-block in response to a row address of the address,
wherein the control circuit is further configured to control the voltage generator and the address decoder in response to the command and the address.

3. The nonvolatile memory device of claim 2, wherein the control circuit comprises:
a bad sub-block information register configured to store bad row addresses of word-lines included in the at least one bad sub-block;
a command decoder configured to decode the command to provide a decoded command;

an address comparator configured to compare the row address with each of the bad row addresses to output a match signal indicating a result of the comparison;

a program/erase cycle information register configured to store program/erase cycle information associated with a first program/erase cycle applied to the at least one normal sub-block and a second program/erase cycle applied to the at least one bad sub-block; and a control signal generator configured to generate the control signals and a first mode signal and a second mode signal that control the address decoder in response to the decoded command and the match signal and based on the program/erase cycle information register.

4. The nonvolatile memory device of claim 2, wherein the control circuit comprises:

a bad sub-block information register configured to store bad row addresses of word-lines included in the at least one bad sub-block;

a command decoder configured to decode the command to provide a decoded command;

an address comparator configured to compare the row address with each of the bad row addresses to output a match signal indicating a result of the compare;

a program/erase cycle counter configured to count a number of program/erase cycles on the at least one bad sub-block to output a counting value, in response to the decoded command and the match signal;

a comparator configured to compare the counting value with the reference counting value to generate a comparison signal;

a program/erase cycle information register configured to store program/erase cycle information associated with a first program/erase cycle applied to the at least one normal sub-block and a second program/erase cycle applied to the at least one bad sub-block; and a control signal generator configured to generate the control signals and a first mode signal and a second mode signal that control the address decoder in response to the decoded command and the match signal and based on the program/erase cycle information register.

5. The nonvolatile memory device of claim 2, wherein, when the command is an erase command to the first memory block, the control circuit is further configured to control the voltage generator and the address decoder such that an erase bias condition during an erase operation on the first memory block is based on whether the at least one bad sub-block is programmed.

6. The nonvolatile memory device of claim 5, wherein, when the at least one bad sub-block is not programmed, the control circuit is further configured to control the address decoder to apply an erase voltage to the substrate, apply a first word-line erase voltage to word-lines associated with the at least one normal sub-block, and apply a second word-line erase voltage to word-lines associated with the at least one bad sub-block, and wherein a level of the second word-line erase voltage is higher than a level of the first word-line erase voltage.

7. The nonvolatile memory device of claim 5, wherein, when the at least one bad sub-block is programmed, the control circuit is further configured to control the address decoder to provide a level of an erase voltage applied to the substrate at a first level during a first time interval and to maintain the level of the erase voltage applied to the substrate at a second level that is higher than the first level during a second time interval succeeding to the first time interval such that the at least one bad sub-block is erased prior to the at least one normal sub-block.

8. The nonvolatile memory device of claim 2, wherein, when the command is a read command to the at least one normal sub-block, the control circuit is further configured to control the voltage generator and the address decoder such that a read bias condition during a read operation on the at least one normal sub-block is based on whether the at least one bad sub-block is programmed.

9. The nonvolatile memory device of claim 2,
wherein each of the memory cells is configured to store M-bits, M being an integer greater than one, and
wherein ones of the memory cells coupled to a boundary word-line of word-lines of the at least one normal sub-block is configured to store N-bits, the boundary word-line being adjacent to the at least one bad sub block, and N being a natural number smaller than M.

10. The nonvolatile memory device of claim 1, wherein a number of word-lines included in the at least one bad sub-block varies according to a position at which the first memory block is formed in the memory cell array.

11. A method of operating a nonvolatile memory device, wherein the nonvolatile memory device comprises a memory cell array comprising a plurality of memory blocks, each of the plurality of memory blocks comprising a plurality of memory cells coupled to word-lines respectively, the word-lines being stacked vertically on a substrate, some memory cells of the plurality of memory cells being selected by a sub-block unit that is smaller than one memory block, the method comprising:

dividing sub-blocks of a first memory block of the plurality of memory blocks into at least one bad sub-block and at least one normal sub-block based on error occurrence frequency of each of the sub-blocks of the first memory block, the at least one bad sub-block and the at least one normal sub-block being adjacent to each other;

applying different duration program/erase cycles to the at least one bad sub-block and the at least one normal sub-block based on a command and an address provided from external to the nonvolatile memory device;

applying a first program/erase cycle of a first duration to the at least one normal sub-block when the address designates the at least one normal sub-block, and apply a second program/erase cycle of a second duration to the at least one bad sub-block until a reference counting value is exceeded; and applying a third program/erase cycle of a third duration to the at least one bad sub-block after the reference counting value is exceeded when the address designates the at least one bad sub-block, wherein the second program/erase cycle of the second duration runs in a first time interval that is less than a second time interval of the first duration of the first program/erase cycle, and wherein the third program/erase cycle runs in a third time interval that is less than the second time interval of the second program/erase cycle.

12. The method of claim 11, wherein applying the different duration program/erase cycles comprises:

determining whether the address designates the at least one bad sub-block;

performing the first program/erase cycle on the at least one normal sub-block, when the address designates the at least one normal sub-block; and performing the second program/erase cycle on the at least one bad sub-block, when the address designates the at least one bad sub-block.

13. The method of claim 11, further comprising:
adjusting a bias condition applied to the first memory block based on whether the at least one bad sub-block is programmed during a memory operation in the first memory block; and
performing the memory operation on the first memory block according to the adjusting the bias condition.

14. The method of claim 13, wherein the memory operation is a read operation on the at least one normal sub-block, and wherein adjusting the bias condition comprises:
applying a first read pass voltage to unselected word-lines in the at least one normal sub-block when the at least one bad sub-block is not programmed; and
applying a second read pass voltage to the unselected word-lines in the at least one normal sub-block when the at least one bad sub-block is programmed,
wherein a level of the second read pass voltage is higher than a level of the first read pass voltage.

15. The method of claim 13, wherein the memory operation comprises an erase operation on the first memory block when the at least one bad sub-block is not programmed, wherein adjusting the bias condition comprises:
applying an erase voltage to the substrate;
applying a first word-line erase voltage to word-lines of the at least one normal sub-block; and
applying a second word-line erase voltage to word-lines of the at least one bad sub-block,
wherein a level of the second word-line erase voltage is higher than a level of the first word-line erase voltage.

16. The method of claim 13, wherein the memory operation is an erase operation on the first memory block when the at least one bad sub-block is programmed, wherein adjusting the bias condition comprises:
maintaining an erase voltage applied to the substrate at a first level during a first time interval; and
maintaining the erase voltage applied to the substrate at a second level during a second time interval succeeding to the first time interval,
wherein the second level is higher than the first level.

17. A storage device comprising:
at least one nonvolatile memory device; and
a memory controller configured to control the at least one nonvolatile memory device,
wherein the at least one nonvolatile memory device comprises:
a memory cell array comprising a plurality of memory blocks, each of the plurality of memory blocks comprising a plurality of memory cells coupled to word-lines respectively, the word-lines being stacked vertically on a substrate, some memory cells of the plurality of memory cells being selected by sub-block unit smaller than one memory block of the plurality of memory blocks; and
a control circuit configured to control access on the memory cell array based on a command and an address provided from the memory controller,
wherein the memory controller is configured to transmit, to the at least one nonvolatile memory device, bad sub-block information associated with bad sub-block included in each of the memory blocks,
wherein the control circuit is configured to divide sub-blocks of a first memory block of the plurality of memory blocks into at least one bad sub-block and at least one normal sub-block based on error occurrence frequency of each of the sub-blocks of the first memory block, and configured to apply different bias conditions to the at least one bad sub-block and the at least one normal sub-block during a memory operation on the first memory block,
wherein the at least one bad sub-block and the at least one normal sub-block are adjacent each other,
wherein the control circuit is further configured to apply a first program/erase cycle of a first duration to the at least one normal sub-block when the address designates the at least one normal sub-block, and apply a second program/erase cycle of a second duration to the at least one bad sub-block until a reference counting value is exceeded and apply a third program/erase cycle of a third duration to the at least one bad sub-block after the reference counting value is exceeded when the address designates the at least one bad sub-block; and
wherein the second program/erase cycle of the second duration runs in a first time interval that is less than a second time interval of the first duration of the first program/erase cycle, and
wherein the third program/erase cycle runs in a third time interval that is less than the second time interval of the second program/erase cycle.

18. The storage device of claim 17, wherein the memory controller comprises an error correction code (ECC) engine configured to perform error detection and correction on data read from the at least one nonvolatile memory device and is configured to generate the bad sub-block information.

* * * * *